US008525167B2

(12) United States Patent
Sasaki et al.

(10) Patent No.: US 8,525,167 B2
(45) Date of Patent: Sep. 3, 2013

(54) LAMINATED CHIPS PACKAGE, SEMICONDUCTOR SUBSTRATE AND METHOD OF MANUFACTURING THE LAMINATED CHIPS PACKAGE

(75) Inventors: Yoshitaka Sasaki, Milpitas, CA (US); Hiroyuki Ito, Milpitas, CA (US); Atsushi Iijima, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 98 days.

(21) Appl. No.: 12/588,713

(22) Filed: Oct. 26, 2009

(65) Prior Publication Data

US 2011/0095289 A1    Apr. 28, 2011

(51) Int. Cl.
*H01L 23/522*   (2006.01)

(52) U.S. Cl.
USPC  257/48; 257/773; 257/E23.142; 257/E23.002; 257/E21.575

(58) Field of Classification Search
USPC ............... 257/48, 773, E23.142, E23.002, 257/E21.575
See application file for complete search history.

(56) References Cited

U.S. PATENT DOCUMENTS

| | | | |
|---|---|---|---|
| 5,953,588 A | 9/1999 | Camien et al. | |
| 7,127,807 B2 | 10/2006 | Yamaguchi et al. | |
| 2007/0145579 A1* | 6/2007 | Hoshino et al. | 257/723 |
| 2009/0315189 A1* | 12/2009 | Sasaki et al. | 257/777 |

OTHER PUBLICATIONS

Gann, "Neo-Stacking Technology," HDI Magazine, Dec. 1999, Miller Freeman, Inc.

* cited by examiner

*Primary Examiner* — Long Pham
(74) *Attorney, Agent, or Firm* — Oliff & Berridge, PLC

(57) ABSTRACT

In a laminated chip package, a plurality of semiconductor plates each having a semiconductor device and a wiring electrode connected to the semiconductor device are laminated. On a side surface for wiring of the laminated chip package, an end face of an inner electrode for examination formed inside the side surface for wiring in the semiconductor plate is formed. The laminated chip package further has an outer electrode for examination connecting the end faces of the inner electrodes for examination along a lamination direction of the semiconductor plates, only for two adjacent semiconductor plates among the semiconductor plates.

19 Claims, 30 Drawing Sheets

LAMINATED CHIPS PACKAGE, SEMICONDUCTOR SUBSTRATE AND METHOD OF MANUFACTURING THE LAMINATED CHIPS PACKAGE

BACKGROUND

1. Field of the Invention

The present invention relates to a laminated chip package including a plurality of laminated chips, a semiconductor substrate for manufacturing the laminated chip package and a method of manufacturing the laminated chip package.

2. Related Background Art

In recent years, electronic devices such as cellular phones and notebook personal computers need to be reduced in weight and improved in performance. With such needs, higher integration of electronic components used for the electronic devices has been required. Further, the higher integration of electronic components has been required also for increase in capacity of a semiconductor memory device.

Recently, System in Package (hereinafter referred to as a "SIP") has attracted attention as a highly integrated electronic component. The SIP is a device created by stacking a plurality of LSIs and mounting them in one package, and a SIP using the three-dimensional mounting technique of laminating a plurality of chips has received attention recently. Known as such a SIP is a package having a plurality of laminated chips, that is, a laminated chip package. The laminated chip package has an advantage that speed up of operation of circuits and reduction in stray capacitance of wiring become possible because the length of the wiring can be reduced as well as an advantage of capability of high integration.

Known as the three-dimensional mounting techniques for manufacturing the laminated chip package include a wire bonding system and a through electrode system. The wire bonding system is a system of laminating a plurality of chips on a substrate and connecting a plurality of electrodes formed on each of the chips and external connecting terminals formed on the substrate by wire bonding. The through electrode system is a system of forming a plurality of through electrodes in each of the laminated chips and realizing wiring between the chips by the through electrodes.

The wire bonding system has a problem of a difficulty in reducing the spaces between the electrodes in a manner that the wires are not in contact with each other, a problem of a difficulty in speeding up the operation of circuits because of a high resistance value of wires, and a problem of a difficulty in reducing the thickness.

Though the above-described problems in the wire bonding system are solved in the through electrode system, the through electrode system has a problem of increased cost of the laminated chip package because many processes are required for forming the through electrodes in each of the chips.

Conventionally known methods of manufacturing the laminated chip package are those disclosed, for example, in U.S. Pat. Nos. 5,953,588 and 7,127,807 B2, for example. In U.S. Pat. No. 5,953,588, the following manufacturing method is described. In this manufacturing method, first, a plurality of chips cut out of a wafer are embedded in an embedding resin. Then, a plurality of leads to be connected to the chips are formed to create a structure called Neo-Wafer. Subsequently, the Neo-Wafer is cut to create a plurality of structures called Neo-chips each including the chip, the resin surrounding the chip, and the plurality of leads. In this event, end faces of the plurality of leads connected to the chips are exposed on side surfaces of the Neo-chips. Then, a plurality of kinds of Neo-chips are laminated to create a laminated body. In this laminated body, the end faces of the plurality of leads connected to the chips at the respective layers are exposed on the same side surface of the laminated body.

Keith D. Gann, "Neo-Stacking Technology", HDI Magazine, December, 1999 describes that a laminated body is formed by the same method as the manufacturing method described in U.S. Pat. No. 5,953,588 and wiring is formed on two side surfaces of the laminated body.

On the other hand, U.S. Pat. No. 7,127,807 B2 discloses a multilayer module which is configured by laminating a plurality of active layers made by forming one or more electronic elements and a plurality of conductive traces on a flexible polymer substrate.

SUMMARY OF THE INVENTION

Incidentally, the laminated chip package is manufactured by the following procedure. First, a wafer (a device wafer) having a plurality of devices formed therein is created by performing wafer process. Then, a plurality of groove portions along scribe lines are formed in the device wafer. Further, a resin such as an epoxy resin, a polyimide resin or the like is embedded in the groove portions to form insulating layers to thereby create a grooved device wafer. Such grooved device wafers are bonded together with an insulating adhesive to create a laminated device wafer. The laminated device wafer is cut along the groove portions to manufacture laminated chip packages.

Meanwhile, in the laminated chip package, a plurality of device plates are stacked one on the other. When the laminated device wafer is cut along the groove portions, the grooved device wafers are also cut along the groove portions. Members in a plate shape formed by cutting the grooved device wafer along the groove portions are the device plates.

In order to manufacture the laminated chip package, the device plates need to be electrically connected with each other. Each of the device plates has a plurality of devices formed therein and side surfaces covered by an insulating layer. Therefore, the following 1) and 2) processes have been conventionally required for the manufacturing process of the laminated chip package. Specifically, 1) assuming that a structure in which device plates are stacked in the vertical direction is a device block, end faces of wirings formed in the device plates are made to appear at one side surface of the device block. 2) Then, secondary wirings (also referred to as connection electrodes) connecting the end faces of the wirings across each of the device plates are formed on the side surface of the device block.

On the other hand, the wiring formed in each device plate is formed to come into contact with not only the secondary wiring but also a connection pad connected to the device. Therefore, in the laminated chip package, a contact resistance may be generated at a portion where the wiring contacts with the secondary wiring and a portion where the wiring contacts with the connection pad.

However, since the secondary wiring connects all of the end faces of the wirings of the device plates in the vertical direction, the laminated chip package has a structure in which a test to confirm the contact resistance between the device plates is difficult to be conducted. As a result, the conventional laminated chip package requires much time for the test to confirm the contact resistance and thus has a problem of it being difficulty to simplify such a test.

The present invention is made to solve the above problem, and it is an object to provide a laminated chip package having a structure in which the process of examining the contact resistance is simplified and efficiently performed, a semiconductor substrate for manufacturing the laminated chip package, and a method of manufacturing the laminated chip package.

To solve the above problem, the present invention is a laminated chip package in which a plurality of semiconductor plates are laminated, each of the semiconductor plates having a semiconductor device and a wiring electrode connected to the semiconductor device, wherein on at least one side surface for wiring of a plurality of side surfaces, an end face of an inner electrode for examination formed inside of the side surface for wiring in the semiconductor plate is formed, and wherein an outer electrode for examination is provided, which connects the end faces of the inner electrodes for examination along a lamination direction of the semiconductor plates, only for two adjacent semiconductor plates among the semiconductor plates.

In the laminated chip package, since the outer electrode for examination only for two adjacent semiconductor plates is formed, an examination only for the two semiconductor plates can be conducted.

In the laminated chip package, it is preferable that a surface layer plate in which a wiring electrode for examination in common with the wiring electrode is formed in place of the inner electrode for examination is laminated at an uppermost position as one of the semiconductor plates, an end face of the wiring electrode for examination is formed on the side surface for wiring, and a plurality of the outer electrodes for examination are provided, and at least one of the outer electrodes for examination connects the end face of the wiring electrode for examination and the end face of the inner electrode for examination along the lamination direction.

Further, in the laminated chip package, it is preferable that two wiring electrodes for examination are provided, and a serial line for examination is formed to be continuous from one of the wiring electrodes for examination to another of the wiring electrodes for examination together with all of the outer electrodes for examination and the inner electrodes for examination.

Furthermore, in the laminated chip package, a plurality of the outer electrodes for examination are provided, and the outer electrodes for examination are intermittently arranged along the lamination direction.

Further, in the laminated chip package, a plurality of the outer electrodes for examination may be provided, and a plurality of outer electrode columns may be provided in each of which the outer electrodes for examination are intermittently arranged along the lamination direction.

The inner electrode for examination may be formed in a shape having end faces connected to the outer electrode for examination at both ends thereof.

Further, the outer electrode for examination may be formed having a height along the lamination direction larger than a thickness of the semiconductor plate.

Further, a plurality of the outer electrodes for examination may be provided, and each of the outer electrodes for examination may be provided for different semiconductor plates.

Further, the end faces of the wiring electrodes may be formed on the side surface for wiring, and a connection electrode may be further provided which connects the end faces of the wiring electrodes arranged along the lamination direction in a manner to step over all of the semiconductor plates.

Further, it is preferable that the semiconductor plate further includes a surface insulating layer formed to cover the semiconductor device, and the wiring electrode for examination is formed in a protruding shape rising above a surface of the surface insulating layer, and the end face thereof is formed in a projecting end face projecting outward from the surface of the surface insulating layer.

Further, the present invention provides a semiconductor substrate having a plurality of groove portions formed along scribe lines, including: a device region in contact with at least any one of the plurality of groove portions and having a semiconductor device formed therein; a surface insulating layer formed to cover the device region and constituting a surface layer of the semiconductor substrate; and an inner electrode for examination formed in a protruding shape rising above a surface of the surface insulating layer, and having extended terminal portions extended inside the groove portion which are formed on both end portions thereof.

It is preferable that the semiconductor substrate further includes a wiring electrode connected to the semiconductor device and formed in a protruding shape rising above a surface of the surface insulating layer.

Further, in case of the above-described semiconductor substrate, it is preferable that the surface insulating layer is structured integrally with an in-groove insulating portion formed inside the groove portion, and the wiring electrode has an extended terminal portion extended from the device region to an inside of the groove portion and formed in a protruding shape rising above a surface of the in-groove insulating portion.

Further, it is preferable that the wiring electrode has a cross side surface projecting outward from the surface of the surface insulating layer and crossing with the surface of the surface insulating layer, a top end face projecting outward from the surface of the surface insulating layer and disposed along the surface of the surface insulating layer, and an embedded portion embedded inward from the surface of the surface insulating layer.

Besides, it is preferable that the semiconductor substrate has a connecting pad connected to the semiconductor device; and a protecting insulating layer having a connecting hole formed at a position for forming the connecting pad, the protecting insulating layer being disposed under the surface insulating layer and formed to cover the device region, the wiring electrode has an electrode pad having an expanded height from a side outer than the surface of the surface insulating layer to the connecting pad.

Further, the present invention provides a method of manufacturing a laminated chip package, including the steps of: a substrate manufacturing step of manufacturing a substrate with inner electrode including a semiconductor device, a plurality of groove portions along scribe lines, a surface insulating layer formed on a surface on a side where the groove portions are formed, and a wiring electrode connected to the semiconductor device and an inner electrode for examination which are formed in a protruding shape rising above a surface of the surface insulating layer; a lamination step of laminating a plurality of the substrates with inner electrode to manufacture a laminated device wafer; a block manufacturing step of making end faces of the inner electrodes for examination appear on a cut surface when the laminated device wafer is cut along the groove portions, as projecting end faces projecting outward from the surface of the surface insulating layer to manufacture a device block; and an outer electrode formation step of forming an outer electrode for examination connecting the end faces of the inner electrodes for examination along a lamination direction of the semiconductor plates only for two adjacent semiconductor plates among the plural semiconductor plates constituting the device block.

It is preferable that in the above-described manufacturing method, in the substrate manufacturing step, a substrate without inner electrode in which a wiring electrode for examination in common with the wiring electrode is formed in place of the inner electrode for examination is manufactured in addition to the substrate with inner electrode, that in the lamination step, the substrate without inner electrode is placed at an uppermost position and a plurality of the substrates with inner electrode are laminated under the substrate without inner electrode to manufacture the laminated device wafer, that in the block manufacturing step, the end faces of the inner electrodes for examination and the end faces of the wiring electrodes for examination are made to appear on the cut surface as the projecting end faces to manufacture the device block, and that in the outer electrode formation step, a plurality of the outer electrodes for examination are formed, and at least one of the outer electrodes for examination is formed to connect the end face of the wiring electrode for examination and the end face of the inner electrode for examination along the lamination direction.

Further, it is preferable that in the substrate manufacturing step, two wiring electrodes for examination are formed on the substrate without inner electrode, and that in the outer electrode formation step, the outer electrodes for examination are formed to form a serial line for examination which is continuous from one of the wiring electrodes for examination to another of the wiring electrodes for examination together with all of the outer electrodes for examination and the inner electrodes for examination.

Further, it is preferable that in the outer electrode formation step, a plurality of the outer electrodes for examination are formed in a manner to be intermittently arranged along the lamination direction.

Further, it is preferable that in the outer electrode formation step, a plurality of the outer electrodes for examination are formed such that a plurality of outer electrode columns are disposed in each of which the outer electrodes for examination are intermittently arranged along the lamination direction.

It is preferable that the manufacturing method further includes the step of: forming a connection electrode which connects the end faces of the wiring electrodes arranged along the lamination direction in a manner to step over all of the semiconductor plates.

It is preferable that in the lamination step, a base and an adhesive used for fixing the substrate without inner electrode are removed to make the wiring electrode and the wiring electrode for examination appear in a protruding shape rising above a surface of the surface insulating layer.

The present invention will be more fully understood from the detailed description given hereinbelow and the accompanying drawings which are given by way of illustration only, and thus are not to be considered as limiting the present invention.

DESCRIPTION OF THE PREFERRED EMBODIMENTS

In the following, embodiments of the present invention will be described with reference to the drawings. Note that the same components will be referred to with the same numerals or letters, while omitting their overlapping descriptions.

First Embodiment

Structures of Semiconductor Wafer 1

To begin with, the structure of a semiconductor wafer 1 will be described with reference to FIG. 1 to FIG. 3. The semiconductor wafer 1 is used for manufacturing a laminated chip package 100 according to an embodiment of the present invention. The laminated chip package 100 is manufactured using later-described semiconductor wafers 51 and 52 in addition to the semiconductor wafer 1. The semiconductor wafer 1 does not have later-described inner electrodes for test 27, 28 and thus has a configuration as a substrate without inner electrode.

Figure 1:
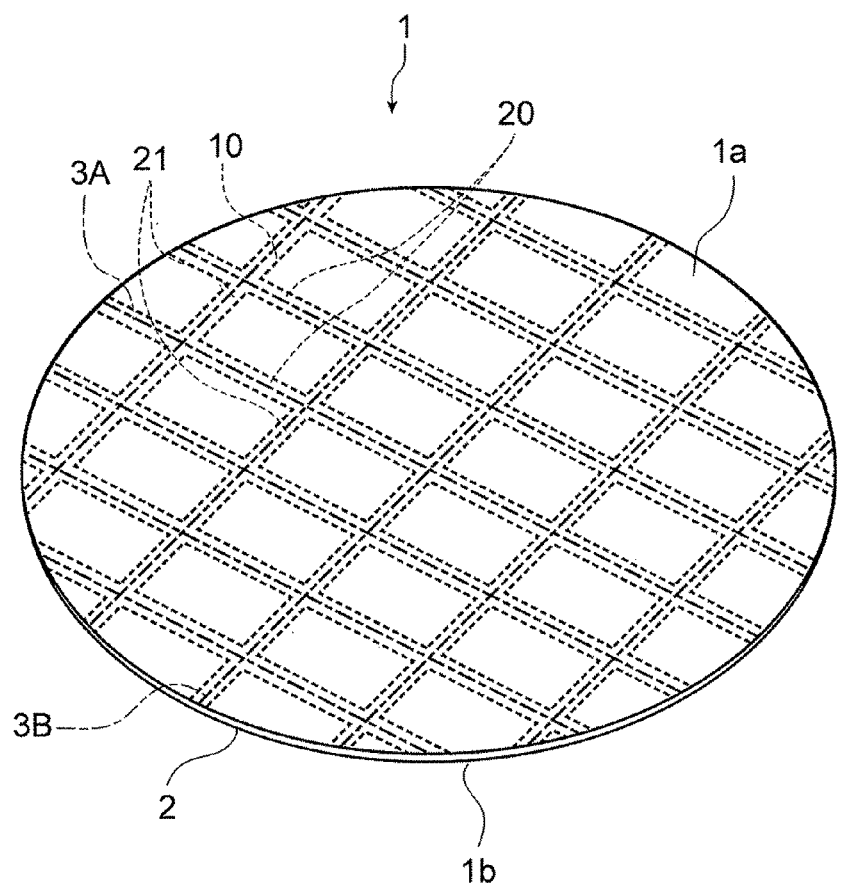
FIG. 1 is a perspective view illustrating the entire semiconductor wafer using for manufacturing a laminated chip package according to a first embodiment of the present invention.
Figure 2:
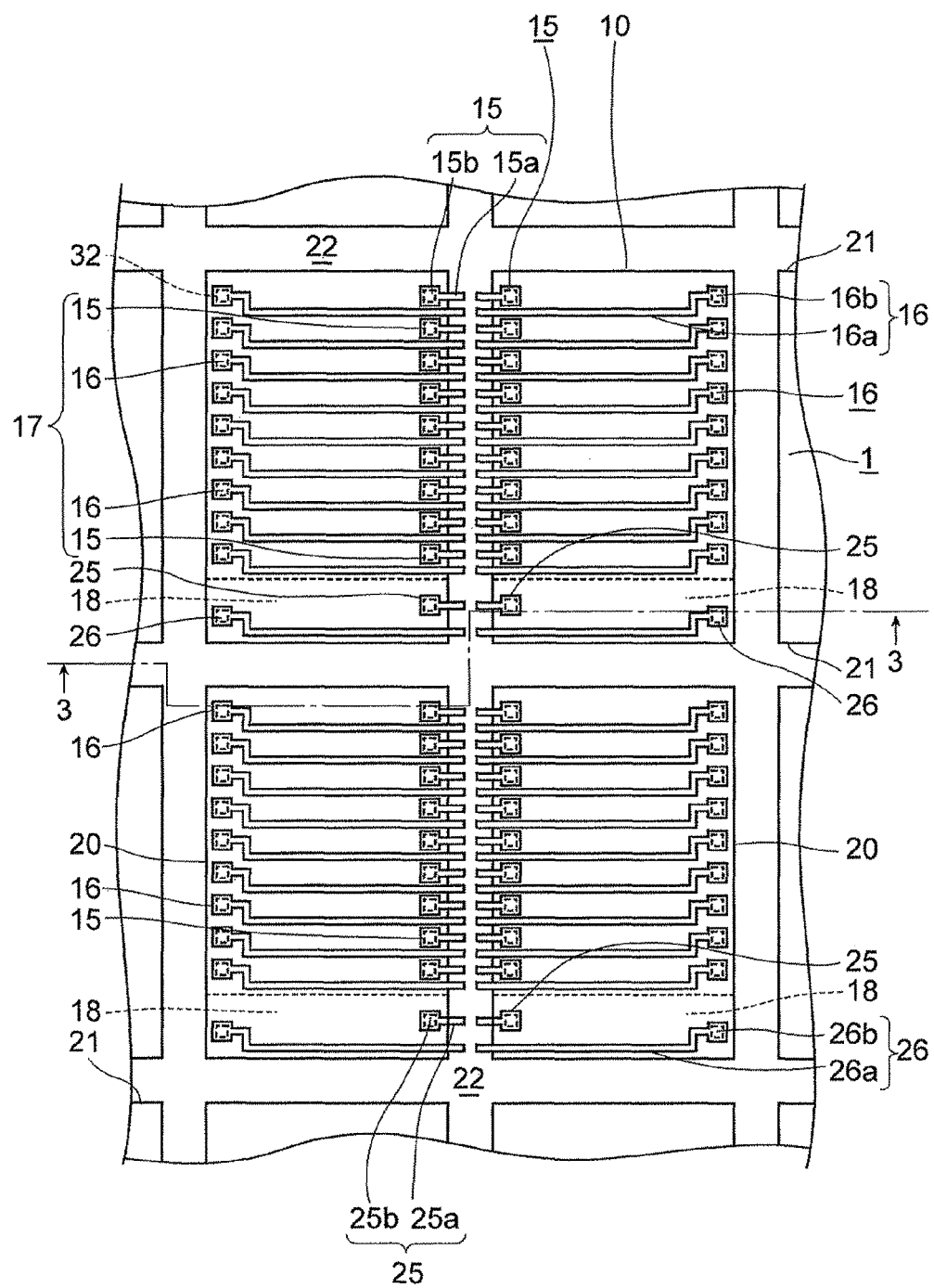
FIG. 2 is a plan view illustrating a device region and a testing region and a region surrounding them formed in the semiconductor wafer.

FIG. 1 is a perspective view illustrating the whole semiconductor wafer 1. FIG. 2 is a plan view illustrating a device region 10 and a testing region 18 and a region surrounding them formed in the semiconductor wafer 1, and FIG. 3 is a sectional view taken along the line 3-3 in FIG. 2.

The semiconductor wafer 1 is composed using a silicon wafer 2. The semiconductor wafer 1 has, as illustrated in FIG. 1, scribe lines 3A and 3B formed on a first surface 1a of the silicon wafer 2 (the rear surface side of the first surface 1a is a second surface 1b). A plurality of each of the scribe lines 3A and 3B are formed on the first surface 1a and formed on straight lines at predetermined intervals along certain directions, respectively. The scribe lines 3A are orthogonal to the scribe lines 3B. The later-described device region 10 and testing region 18 (which will also be referred to as "examining region") are formed within a region surrounded by the adjacent scribe lines 3A, 3A and 3B, 3B.

The semiconductor wafer 1 further has groove portions 20 and 21 formed in the first surface 1a. The groove portions 20 and 21 are formed along the scribe lines 3A and 3B, respectively, and each of them has a depth of about 20 to 60 µm and a width of about 50 to 120 µm.

Figure 3:
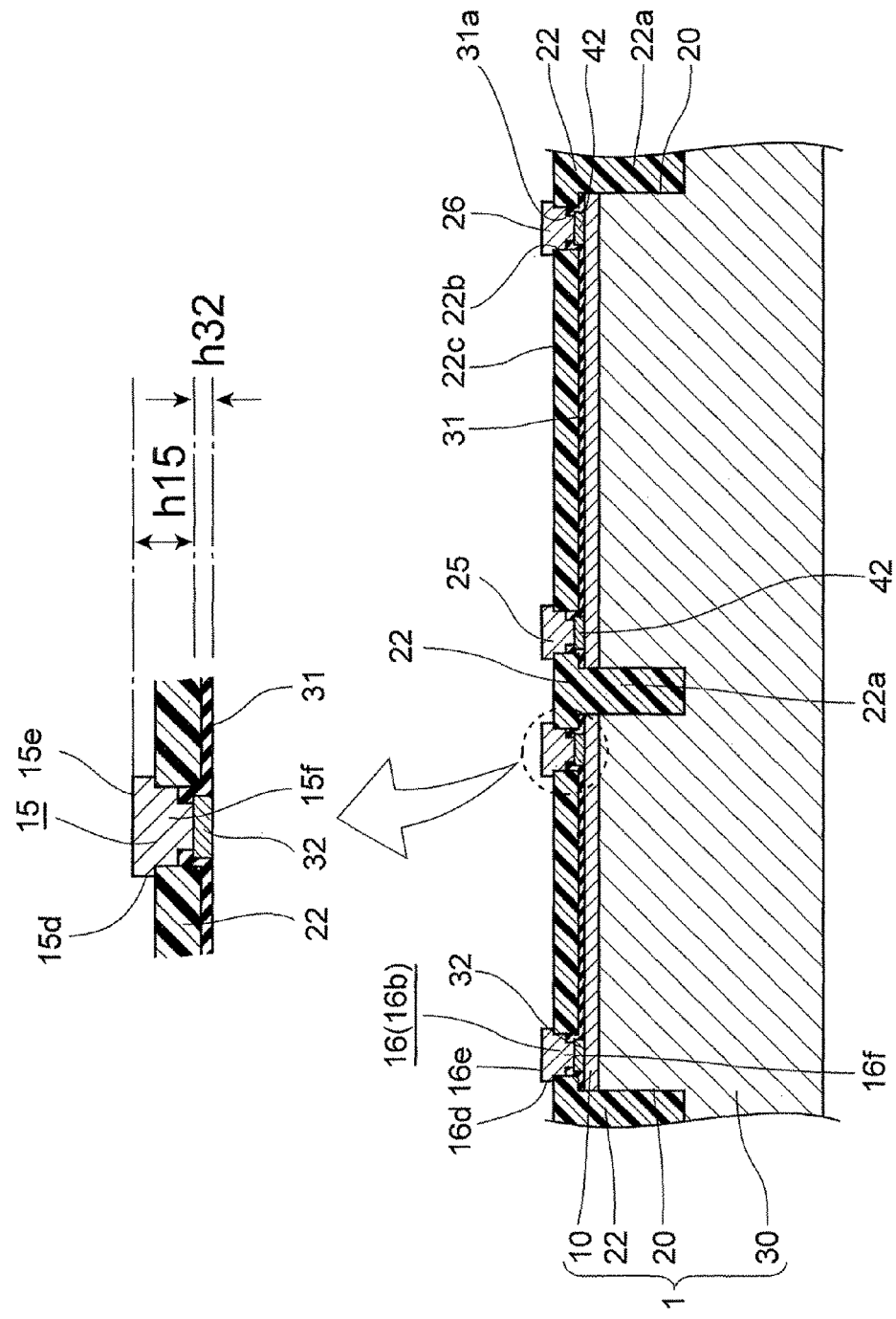
FIG. 3 is a sectional view taken along the line 3-3 in FIG. 2.

The semiconductor wafer 1 has a surface insulating layer 22 as illustrated in detail in FIG. 3. The surface insulting layer 22 is formed to cover the device region 10 and testing region 18, and thus the surface insulting layer 22 covers almost the whole first surface 1a of the semiconductor wafer 1 to constitute a surface layer of the semiconductor wafer 1. The surface insulating layer 22 has a larger thickness than that of a later-described protecting insulating layer 31 and has a surface 22c formed flat, and is disposed at the outermost position of the semiconductor wafer 1 except for portions where later-described wiring electrodes 15, wiring electrodes 16 and wiring electrodes for test 25, 26 (which will also be referred to as "wiring electrodes for examination") are formed.

Further, the surface insulating layer 22 is structured integrally with in-groove insulating portions 22a formed inside the groove portions 20 and 21, and is thus formed in one body without joints between the in-groove insulating portions 22a and other portions. The surface insulating layer 22 is formed with a plurality of contact holes 22b, and one wiring electrode 15 or one wiring electrode 16 or one wiring electrode for test 25 or one wiring electrode for test 26 is formed in each of the contact holes 22b.

The surface insulating layer 22 can be formed using a resin such as an epoxy resin or a polyimide resin, or an insulating material made of silicon silicate glass (SOG) or the like. In this embodiment, a case using a resin for the surface insulating layer 22 is discussed. It is especially preferable to form the surface insulating layer 22 using a resin having a low thermal expansion coefficient. This ensures that when the semiconductor wafer 1 is cut along the groove portions 20 and 21 by a dicing saw, the cutting can be easily performed.

The semiconductor wafer 1 has a silicon substrate 30 composed of the silicon wafer 2, and upper portions thereof are the device regions 10, the testing region 18. A plurality of connecting pads 32, connecting pads 42 are formed respectively on the surface of the device region 10, the testing region 18, and a portion other than the connecting pads 32, connecting pads 42 is covered with the protecting insulating layer 31.

The protecting insulating layer 31 is disposed under the surface insulating layer 22 and formed to cover the device region 10 and testing region 18. The protecting insulating layer 31 is made of silicon dioxide ($SiO_2$) or the like, and has connecting holes 31a formed at positions where the connecting pads 32, 42 are to be formed. The connecting holes 31a are formed to expose the connecting pads 32, 42 so as to connect the later-described wiring electrodes 15, 16, wiring electrodes for test 25, 26 to the connecting pads 32, 42. The connecting pads 32 are connected to the semiconductor device in the device region 10 (see FIG. 4 for details).

The device region 10 and the testing region 18 adjoin each other. The whole of the device region 10 and the testing region 18 are a rectangular region surrounded by the adjacent groove portions 20 and 20 and the groove portions 21 and 21 as illustrated in detail in FIG. 2. A plurality of the device regions 10 and the testing region 18 are formed on the first surface 1a, and each of them is a unit region divided from adjacent regions by the groove portions 20 and 21.

Each of the device regions 10 has the memory portion formed on the first surface 1a by performing wafer process, and a plurality of wiring electrodes 15 and 16 are formed. Wiring electrodes for test 25 and 26 are formed on the testing region 18. Note that the wafer process means a manufacturing process of forming a semiconductor element and an integrated circuit on the wafer such as the silicon wafer 2 or the like.

In addition to the memory portion, an integrated circuit and a semiconductor element such as a CPU, a sensor, a drive circuit for the sensor may be formed as the semiconductor devices within the device region 10. Further, a memory portion and an integrated circuit constituting a controller for controlling the memory portion may be formed in the device region 10.

The wiring electrode 15 is made of a conductive material such as Cu or the like. The wiring electrode 15 has an extended terminal portion 15a and a rectangular electrode pad 15b, and the extended terminal portion 15a and the rectangular electrode pad 15b have, as a whole, a protruding structure rising above the surface 22c of the surface insulating layer 22 into a three-dimensional shape.

Figure 11:
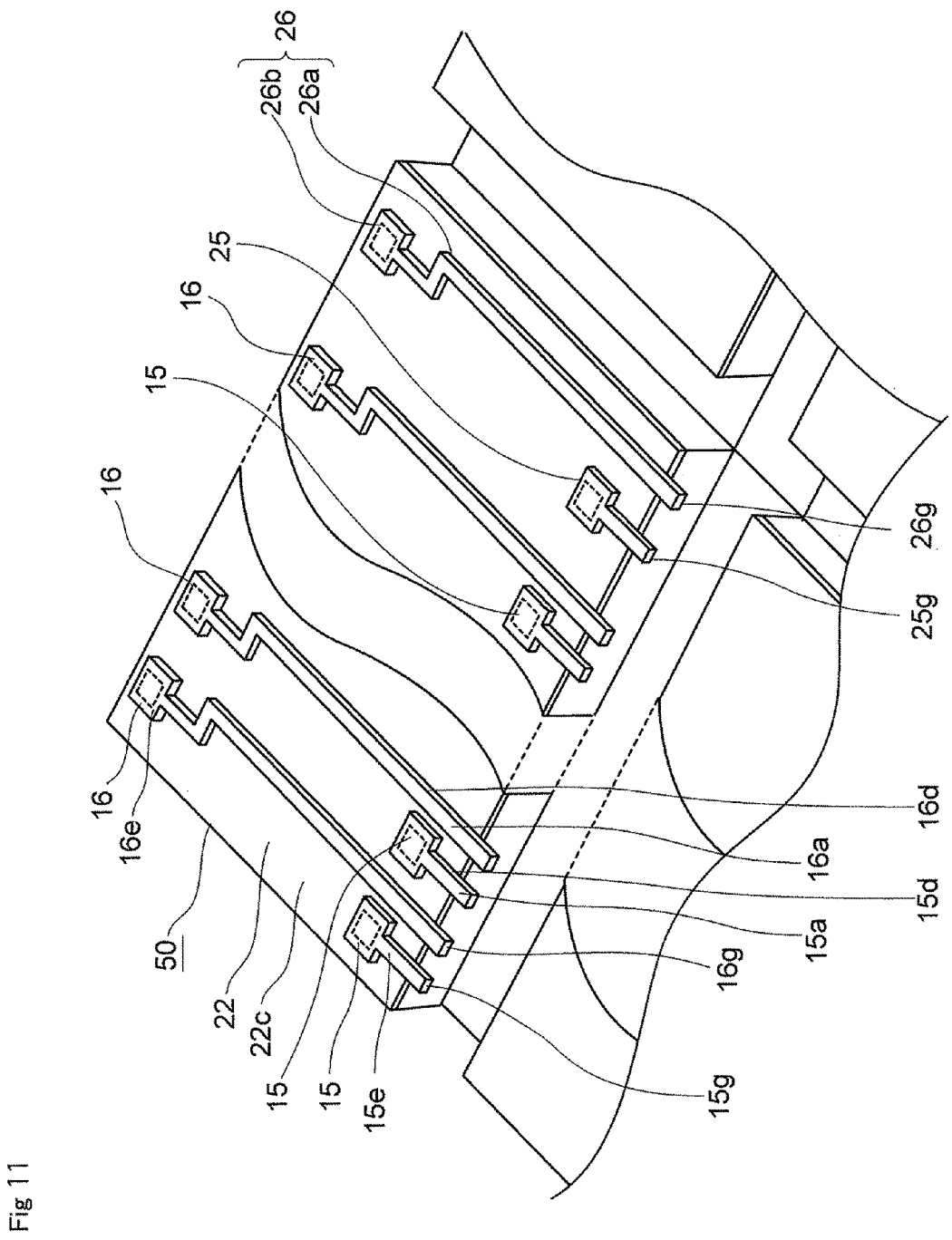
FIG. 11 is a perspective view illustrating an essential part of the semiconductor wafer used for manufacturing the device plate in FIG. 18.
Figure 18:
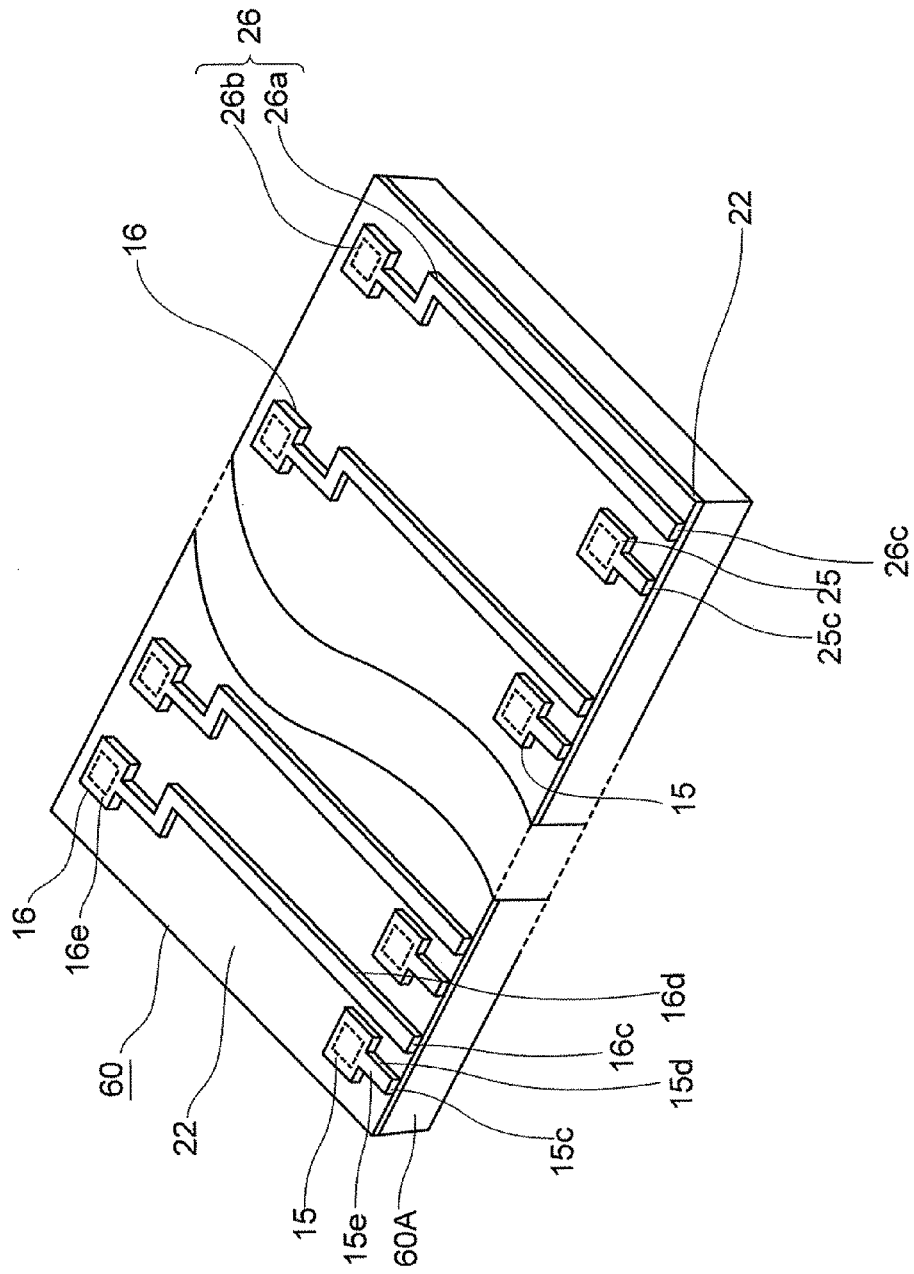
FIG. 18 is a perspective view illustrating an example of a device plate constituting the laminated chip package.

The wiring electrode 15 is illustrated in detail in FIG. 11 and FIG. 18 in addition to FIG. 3. An end face 15g of the extended terminal portion 15a of the wiring electrode 15 is a projecting end face projecting outward from the surface 22c of the surface insulating layer 22. Further, the wiring electrode 15 has a cross side surface 15d, a top end face 15e, and an embedded portion 15f.

The cross side surface 15d is a side surface portion projecting outward from the surface 22c of the surface insulating layer 22 and crossing with the surface 22c to rise up from (almost intersecting to) the surface 22c. The top end face 15e is connected to the cross side surface 15d and projects outward from the surface 22c, and further has a rectangular portion disposed in a direction along the surface 22c and a band-shaped portion extending from the rectangular portion in a direction along the surface 22c toward the groove portion 20. The embedded portion 15f is a portion embedded inward from the surface 22c to connect to the connecting pad 32.

The electrode pad 15b is composed of the cross side surface 15d, the top end face 15e, and the embedded portion 15f, and the extended terminal portion 15a is composed of the cross side surface 15d and the top end face 15e.

The electrode pad 15b is connected to the connecting pad 32 via the contact hole 22b and the connecting hole 31a which are arranged to be stacked one on the other, and has a depth reaching the connecting pad 32. More specifically, the electrode pad 15b has a height (an expanded height) h15 expanded from the top end face 15e outer than the surface 22c to the connecting pad 32 via the contact hole 22b and the connecting hole 31a. The expanded height h15 is larger than a height h32 of the connecting pad 32 (h15>h32). For example, h15 is about 2 to 6 μm, and h32 is about 0.5 to 1 μm.

The wiring electrode 16 is also made of a conductive material such as Cu or the like. The wiring electrode 16 has an extended terminal portion 16a and a rectangular electrode pad 16b, and the extended terminal portion 16a and the electrode pad 16b have, as a whole, a protruding structure like the wiring electrode 15. An end face 16g of the extended terminal portion 16a of the wiring electrode 16 is a projecting end face projecting outward from the surface 22c.

Further, the wiring electrode 16 has a cross side surface 16d, a top end face 16e, and an embedded portion 16f. The cross side surface 16d is a side surface portion crossing with the surface 22c, like the cross side surface 15d. The top end face 16e has a rectangular portion disposed in a direction along the surface 22c and a band-shaped portion extending from the rectangular portion in a direction along the surface 22c toward the groove portion 20, like the top end face 15e. The embedded portion 16f is a portion embedded inward from the surface 22c and connected to the connecting pad 32, like the embedded portion 15f. Further, the electrode pad 16b is composed of the cross side surface 16d, the top end face 16e, and the embedded portion 16f, and the extended terminal portion 16a is composed of the cross side surface 16d and the top end face 16e. The electrode pad 16b also has an expanded height like the electrode pad 15b.

The extended terminal portions 15a and the electrode pads 15b of the wiring electrodes 15 are formed along a part of the outer periphery of the device region 10 and testing region 18, whereas the extended terminal portions 16a of the wiring electrodes 16 are formed across the device region 10. Further, the electrode pads 16b are disposed along a part of the outer periphery of the device region 10 and testing region 18 to be opposed to the electrode pads 15b.

Respective portions of the extended terminal portions 15a and the extended terminal portions 16a extend from the device region 10 into the groove portion 20. More specifically, the extended terminal portions 15a and the extended terminal portions 16a are formed such that their respective portions on their tip sides apart from the electrode pads 15b and 16b bulge out from an edge portion of the groove portion 20 and stay inside the groove portion 20 in the width direction. Further, the extended terminal portions 15a and the extended terminal portions 16a are formed such that their respective portions extending out from the device region 10 are in a protruding shape rising above the surface 22c of the in-groove insulating portions 22a.

The wiring electrode for test 25 is made of a conductive material such as Cu or the like. The wiring electrode for test 25 has a structure in common with the wiring electrode 15. The wiring electrode for test 25 has an extended terminal portion 25a and an electrode pad 25b, and the extended terminal portion 25a and the electrode pad 25b have, as a whole, a protruding structure rising above the surface 22c of the surface insulating layer 22 into a three-dimensional shape. The extended terminal portion 25a has a structure in common with the extended terminal portion 15a. The electrode pad 25b has a structure in common with the electrode pad 15b. The end face 25g of the extended terminal portion 25a is a projecting end face in common with the end face 15g.

Besides, the wiring electrode for test 26 is made of a conductive material such as Cu or the like. The wiring electrode for test 26 has a structure in common with the wiring electrode 16. The wiring electrode for test 26 has an extended terminal portion 26a and an electrode pad 26b, and the extended terminal portion 26a and the electrode pad 26b have, as a whole, a protruding structure rising above the surface 22c of the surface insulating layer 22 into a three-dimensional shape. The extended terminal portion 26a has a structure in common with the extended terminal portion 16a. The electrode pad 26b has a structure in common with the electrode pad 16b. The end face 26g of the extended terminal portion 26a is a projecting end face in common with the end face 16g.

The semiconductor wafer 1 has the extended terminal portions 15a, the extended terminal portions 16a and the extended terminal portions 25a, the extended terminal portions 26a Therefore, in the cut surfaces when the semiconductor wafer 1 is cut along the groove portions 20, the later-described end faces 15c, 16c and 25c, 26c appear projecting outward from the surface 22c.

Further, a number of the wiring electrodes 15 and 16 are alternately arranged along the groove portion 20. These wiring electrodes 15 and 16 are united together to form a wiring electrode group 17. Further, in the wiring electrodes 15 and 16, the extended terminal portions 15a and 16a are extended only to the groove portion 20 on the left side or the right side that is a part of the four groove portions which are all of the groove portions surrounding and contacting with the device region 10 and testing region 18, that is, the adjacent two groove portions 20 and 20 and two groove portions 21 and 21. The wiring electrode group 17 has an unevenly distributed structure by such an unevenly distributed arrangement of the extended terminal portions 15a and 16a.

Figure 4:
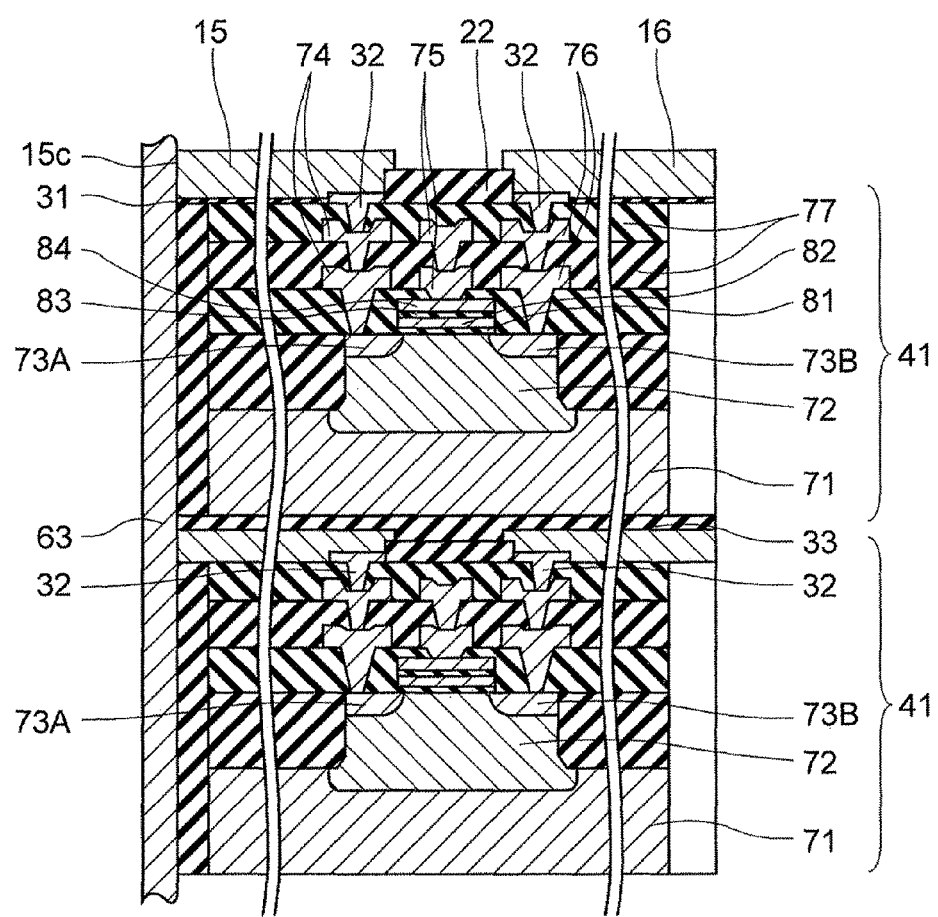
FIG. 4 is a sectional view mainly illustrating memory cells of a laminated chip package using two semiconductor wafers.

In the memory portion of the device region 10, a number of memory cells 41 as the semiconductor devices are formed. The memory cell 41 has a structure as illustrated in FIG. 4. FIG. 4 is a sectional view mainly illustrating memory cells 41 of a later-described laminated chip package 100 using two semiconductor wafers 1.

To the memory cell 41, the wiring electrodes 15 and 16 are connected via the connecting pads 32. The memory cell 41 is formed on the surface of an N-type substrate 71 constituting the semiconductor wafer 1. In FIG. 4, two memory cells 41 are laminated one on the other via an adhesive layer 33. The adhesive layer 33 is formed by an adhesive used when the semiconductor wafers 1 are bonded together.

Each of the memory tells 41 constitutes a flash memory and is formed on a P-type well 72 which is formed on the surface of the N-type substrate 71. The memory cell 41 has a source 73A and a drain 73B, insulating layers 77, an insulating film 81, a floating gate 82, an insulating film 83 and a control gate 84. The memory cell 41 further has a source electrode 74, a drain electrode 76 and a gate electrode 75.

Both of the source 73A and the drain 73B are N-type regions and connected with the source electrode 74 and the drain electrode 76, respectively. The insulating layers 77 are formed with contact holes for connecting the connecting pads 32 to the source electrode 74 and the drain electrode 76, respectively. The source electrode 74, the gate electrode 75, and the drain electrode 76 are connected to the source 73A, the control gate 84 and the drain 73B via the corresponding contact holes, respectively.

Method of Manufacturing Semiconductor Wafer 1

Figure 5:
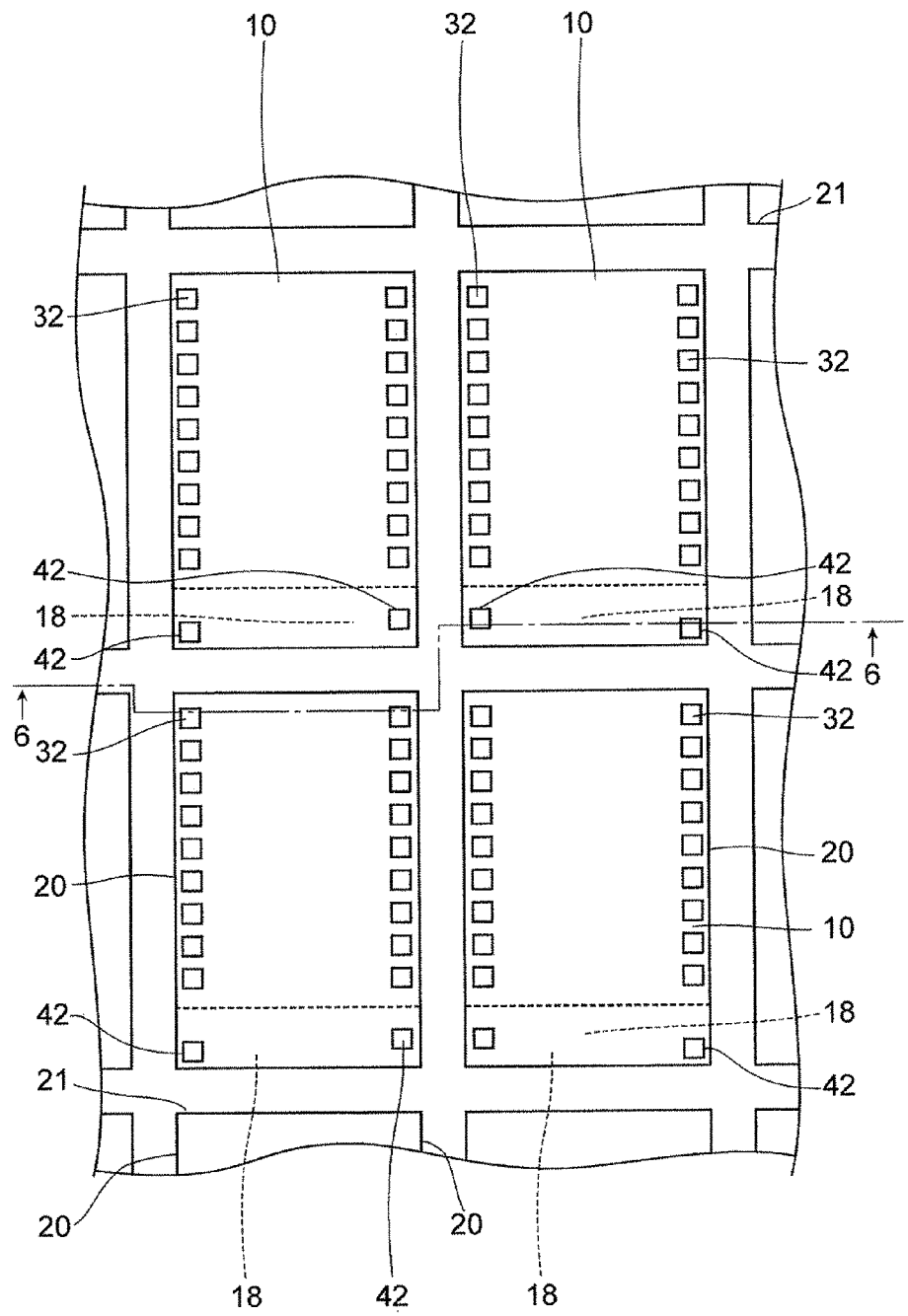
FIG. 5 is a plan view similar to FIG. 2, illustrating the partially manufactured semiconductor.
Figure 6:
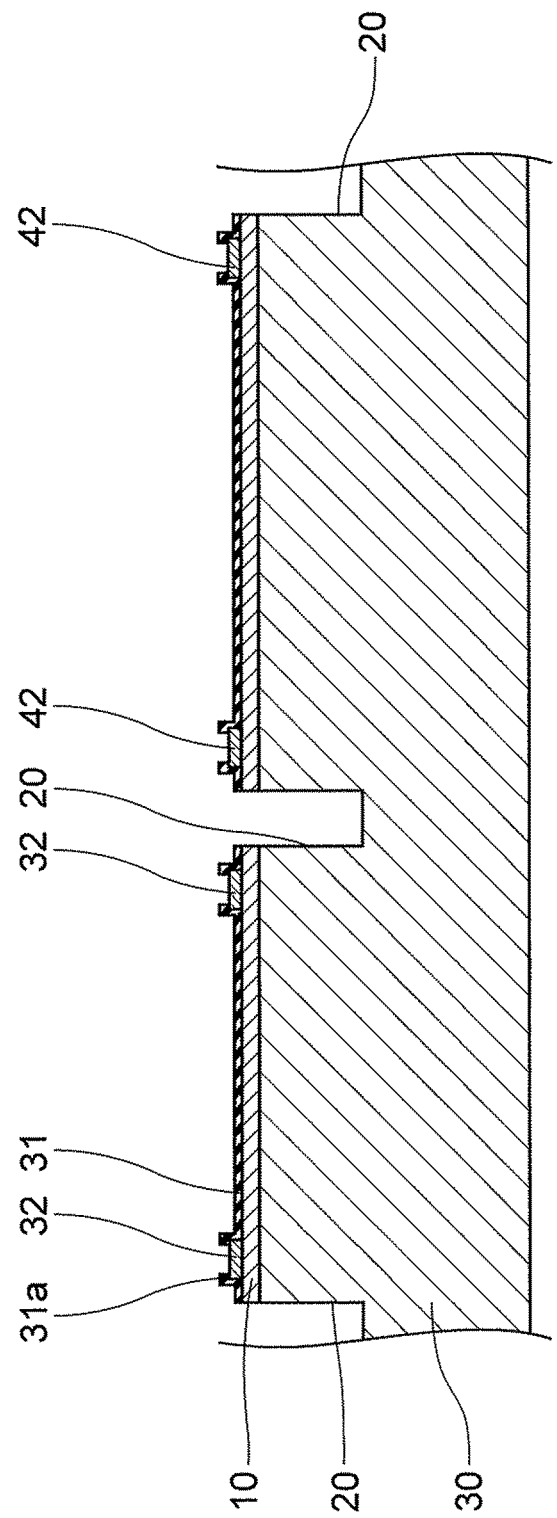
FIG. 6 is a sectional view taken along the line 6-6 in FIG. 5.
Figure 7:
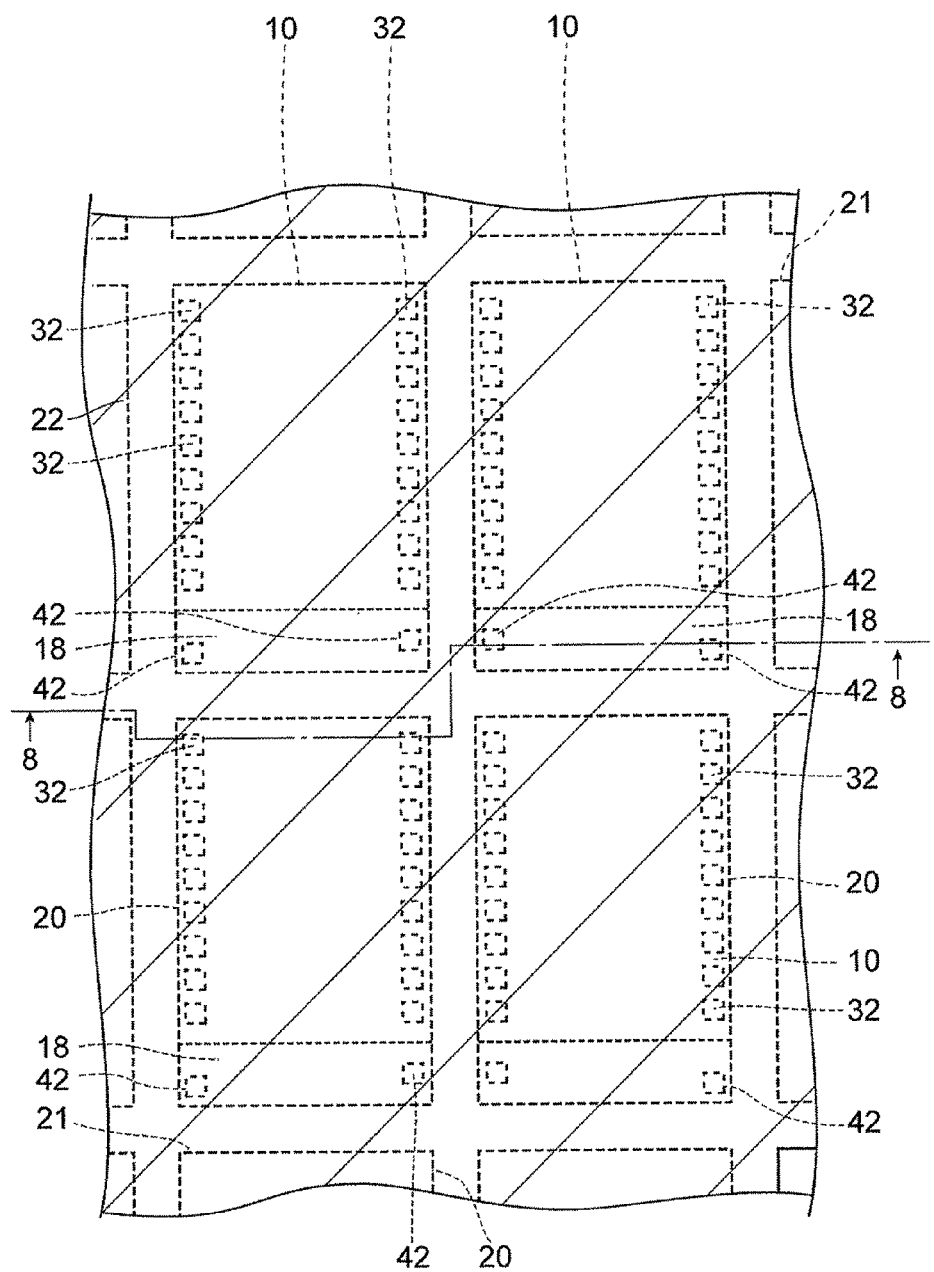
FIG. 7 is a plan view similar to FIG. 2, illustrating the semiconductor wafer subsequent to that in FIG. 5.
Figure 8:
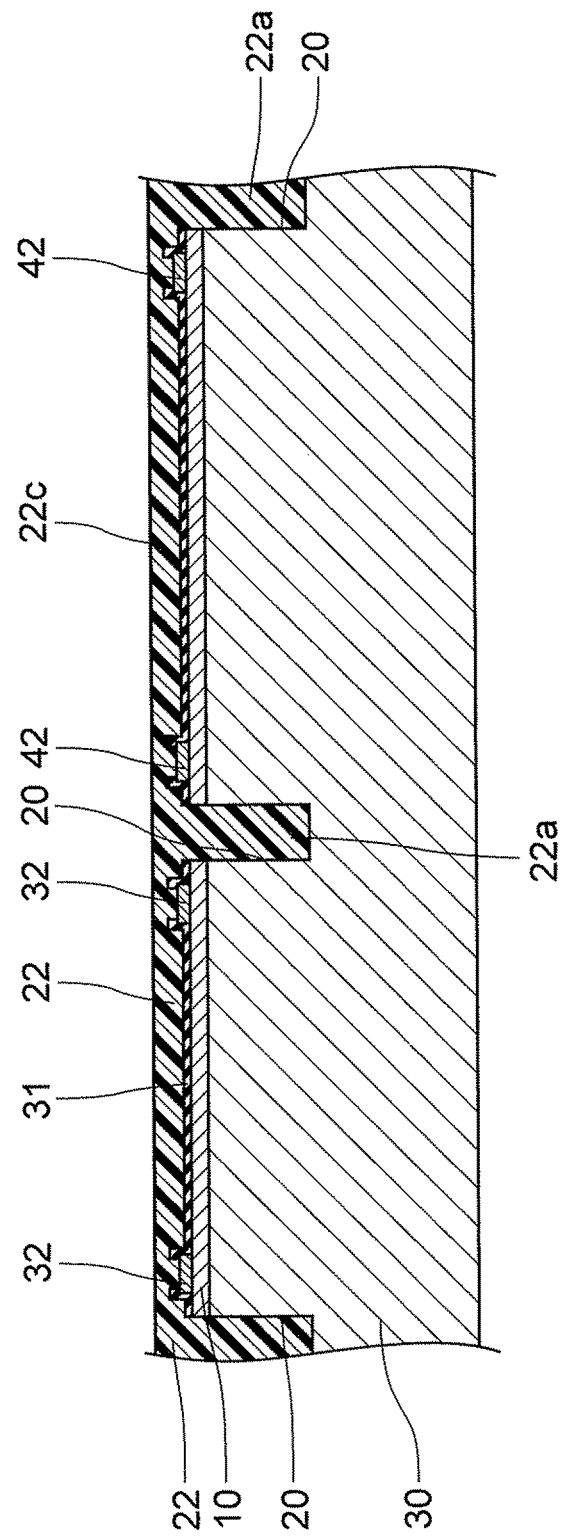
FIG. 8 is a sectional view taken along the line 8-8 in FIG. 7.
Figure 9:
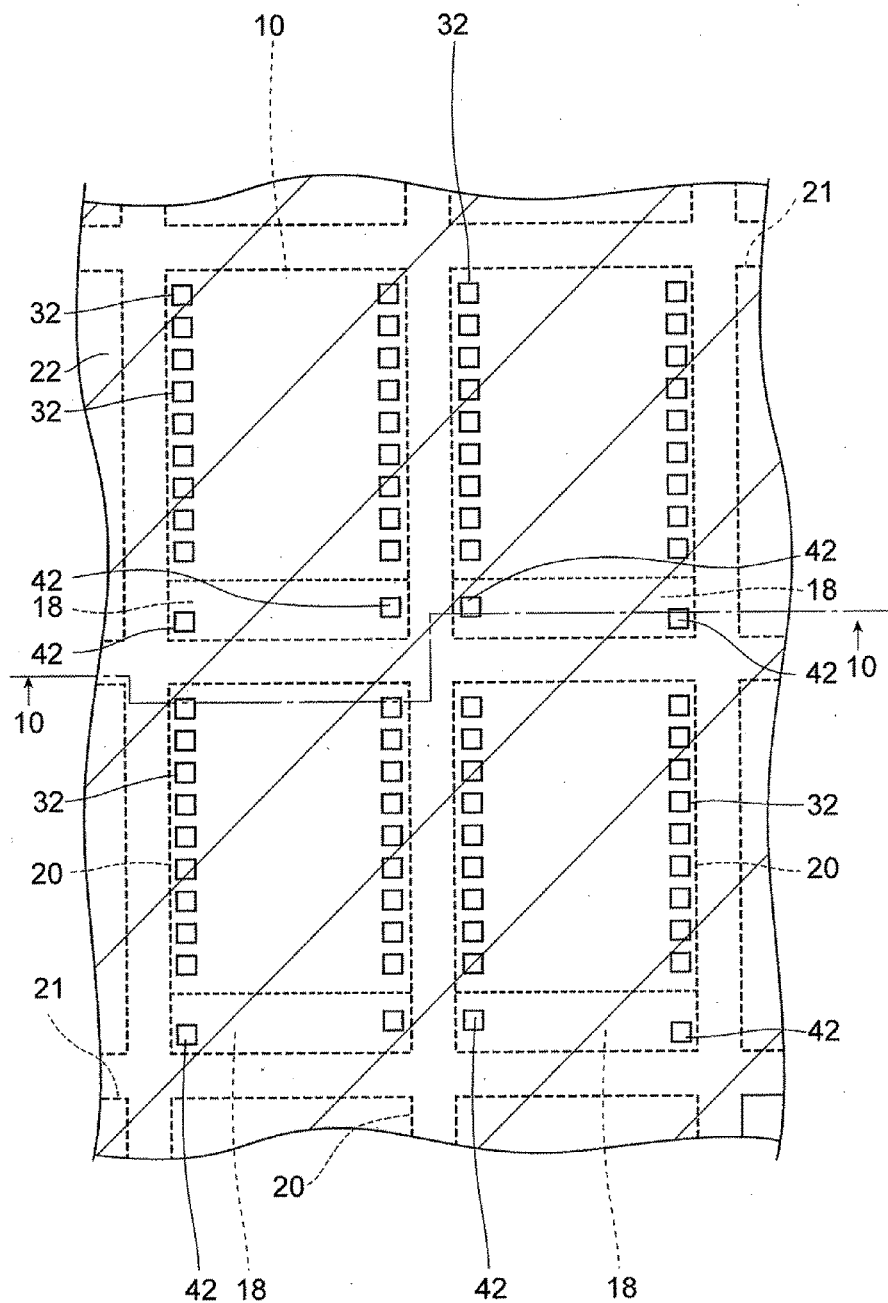
FIG. 9 is a plan view similar to FIG. 2, illustrating the semiconductor wafer subsequent to that in FIG. 7.
Figure 10:
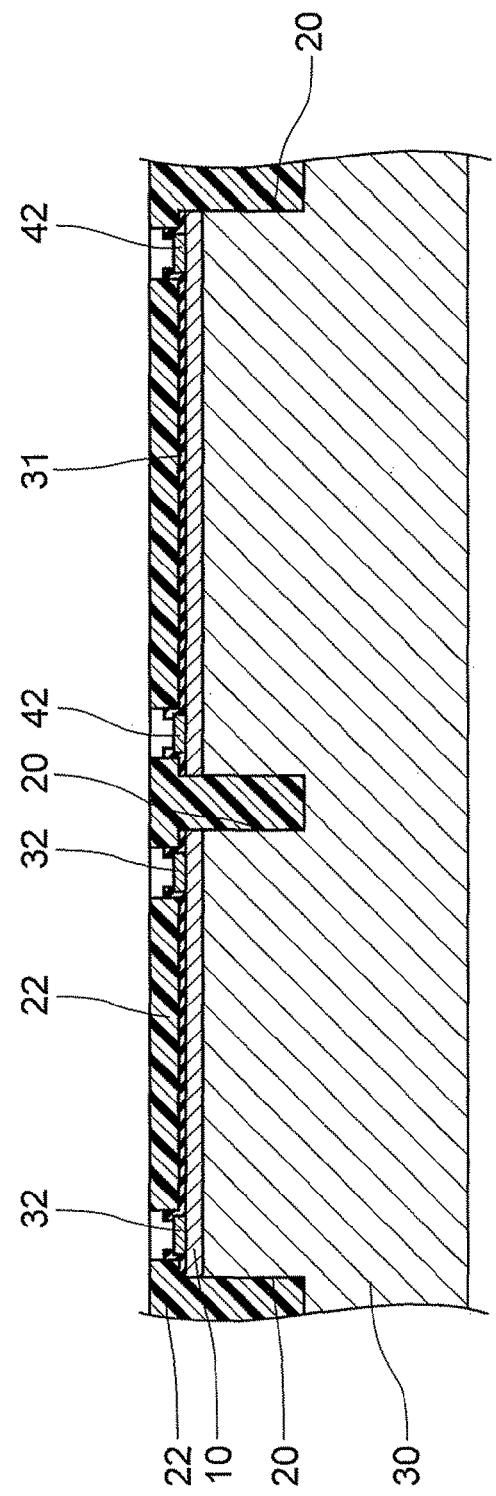
FIG. 10 is a sectional view taken along the line 10-10 in FIG. 9.

Subsequently, the method of manufacturing the semiconductor wafer 1 having the above-described structure will be described with reference to FIG. 5 to FIG. 10. Here, FIG. 5 is a plan view similar to FIG. 2, illustrating the partially manufactured semiconductor wafer, and FIG. 6 is a sectional view taken along the line 6-6 in FIG. 5. FIG. 7 is a plan view similar to FIG. 2, illustrating the semiconductor wafer subsequent to that in FIG. 5, and FIG. 8 is a sectional view taken along the line 8-8 in FIG. 7. FIG. 9 is a plan view similar to FIG. 2, illustrating the semiconductor wafer subsequent to that in FIG. 7, and FIG. 10 is a sectional view taken along the line 10-10 in FIG. 9. Note that hatching is given to the surface insulating layer 22 in FIG. 7 and FIG. 9 for convenience of illustration.

For manufacturing the semiconductor wafer 1, a wafer (unprocessed wafer) is prepared which has memory portions and a plurality of connecting pads 32 formed in the device regions 10 and a plurality of connecting pads 42 formed in the testing regions 18 by performing wafer process. Then, the protecting insulating layer 31 is formed on the first surface 1a for the unprocessed wafer, and then the connecting holes 31a are formed at the locations in the protecting insulating layer 31 where the connecting pads 32, 42 are to be formed, as illustrated in FIG. 6. Then, the groove portions 20 and 21 are formed along the scribe lines 3A and 3B. The groove portions 20 and 21 can be formed by the dicing saw, and may be formed by etching such as the reactive ion etching or the like.

Subsequently, a resin, for example, an epoxy resin, a polyimide resin or the like is applied to the entire first surface 1a. Then, the applied resin spreads over the entire surface of the unprocessed wafer and further flows into the groove portions 20 and 21. Subsequently, the surface of the unprocessed wafer is polished to be planarized. Thus, the surface insulating layer 22 is formed to cover the entire surface of the unprocessed wafer. The portions flowed into the groove portions 20 and 21 form the in-groove insulating portions 22a, so that the surface insulating layer 22 is formed integrally with the in-groove insulating portions 22a.

Subsequently, as illustrated in FIG. 9 and FIG. 10, the contact holes 22b are formed in the surface insulating layer 22 to expose the connecting pads 32, 42. Thereafter, the wiring electrodes 15, 16 and the wiring electrodes for test 25, 26 are formed. The wiring electrodes 15, 16 and the wiring electrodes for test 25, 26 are formed in a shape having the above-described protruding structure and including the extended terminal portions 15a, 16a and the extended terminal portions 25a, 26a respectively. The wiring electrodes 15, 16 and the wiring electrodes for test 25, 26 can be formed, for example, in the procedure as follows.

First, a not-shown seed layer for plating is formed on the surface insulating layer 22. Next, a frame (not shown) including groove portions is formed on the seed layer. The frame is formed, for example, by patterning a photoresist by the photolithography. Further, a plating layer which will be portions of the wiring electrodes 15, 16 and the wiring electrodes for test 25, 26 is formed within the groove portions of the formed frame and on the seed layer. Subsequently, the frame is removed, and a portion of the seed layer other than the portion which exists under the plating layer is removed by etching. By the above processing, the wiring electrodes 15, 16 and the wiring electrodes for test 25, 26 can be formed of the plating layer and the seed layer thereunder.

Because, the wiring electrodes 15, 16 and the wiring electrodes for test 25, 26 are formed after the formation of the surface insulating layer 22, the extended terminal portions 15a, 16a and 25a, 26a are formed in a manner that they are wholly disposed on the surface 22c of the surface insulating layer 22. The electrode pads 15b, 16b and 25b, 26b are formed such that their peripheral portions are disposed on the surface 22c and their center portions are embedded inward from the surface 22c to connect with the connecting pads 32.

Structures of Semiconductor Wafer 51

Figure 12:
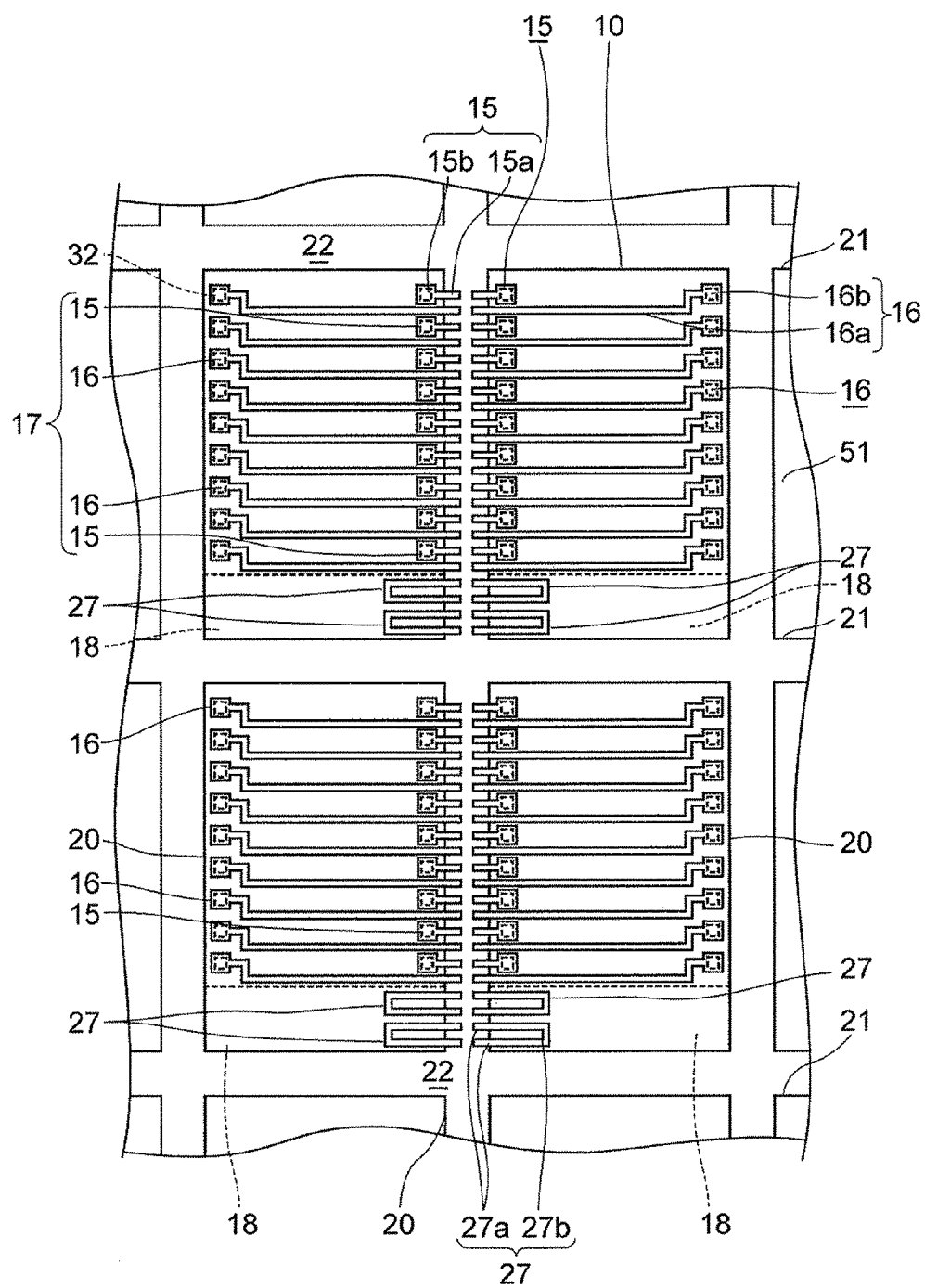
FIG. 12 is a plan view illustrating a device region and a testing region and a region surrounding them formed in another semiconductor wafer used for manufacturing a laminated chip package.

Next, the structure of a semiconductor wafer 51 will be described with reference to FIG. 12. The semiconductor wafer 51 is different from the above-described semiconductor wafer 1 in that two inner electrodes for test 27 are formed in place of the wiring electrodes for test 25, 26, in the testing region 18, but has the same configuration in the other points. The semiconductor wafer 51 has the inner electrodes for test 27 formed thereon and thus has a configuration as a substrate with inner electrode.

The inner electrode for test 27 is an inner electrode for examination according to this embodiment made of a conductive material such as Cu or the like and has a turn structure in a substantially U-shape in which extended terminal portions 27a are formed at both end portions thereof, respectively. The inner electrode for test 27 has, as a whole, a protruding structure rising above the surface 22c into a three-dimensional shape. The inner electrode for test 27 is formed under the conditions in common with the wiring electrodes 15, 16 though it is different in shape from the wiring electrodes 15, 16.

The inner electrode for test 27 has the two extended terminal portions 27a, 27a and an intermediate portion 27b. The inner electrode for test 27 is formed in one body to be continuous from one of the extended terminal portions 27a to the other extended terminal portion 27a passing through the intermediate portion 27b. When current flows to the inner electrode for test 27 from the one extended terminal portion 27a, the current passes through the intermediate portion 27b, turns back, and flows out from the other extended terminal portion 27a.

The two extended terminal portions 27a are extended, similarly to the extended terminal portion 15a, from the testing region 18 to the inside of the groove portion 20. Therefore, the two extended terminal portions 27a are partially cut afterward along the groove portion 20, so that later-described respective end faces 27c appear. On the end faces 27c, later-described outer electrodes for test 65, 66 are formed.

Note that though the illustrated inner electrode for test 27 is formed in a structure in which the two extended terminal portions 27a are substantially orthogonal to the intermediate portion 27b, it may be formed in a U-shape by connecting the two extended terminal portions 27a by a curved intermediate portion 27b.

Structure of Semiconductor Wafer 52

Figure 13:
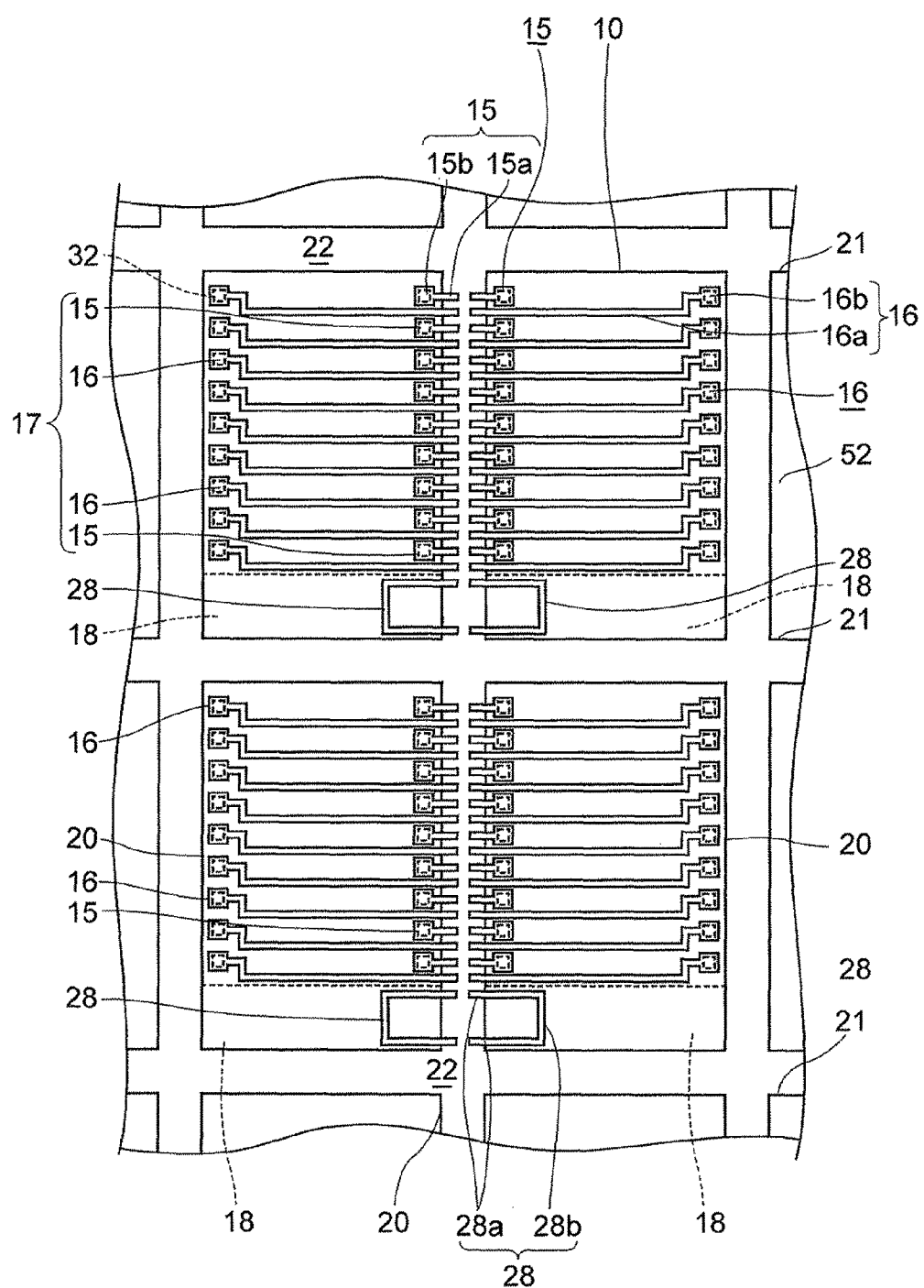
FIG. 13 is a plan view illustrating a device region and a testing region and a region surrounding them formed in still another semiconductor wafer.

The structure of a semiconductor wafer 52 will be described with reference to FIG. 13. The semiconductor wafer 52 is different from the above-described semiconductor wafer 51 in that an inner electrode for test 28 is formed in place of the two inner electrodes for test 27, in the testing region 18, but has the same configuration in the other points. The semiconductor wafer 52 has the inner electrode for test 28 formed thereon and thus has a configuration as a substrate with inner electrode.

The inner electrode for test 28 is different from the above-described inner electrode for test 27 in that two extended terminal portions 28a, 28a are formed with a large space therebetween, but has the common structure in the other points. The inner electrode for test 28 has the same turn structure in a substantially U-shape as that of the inner electrode for test 27, and has a protruding structure. The inner electrode for test 28 is different in shape from the wiring electrodes 15, 16, but is formed under the conditions in common with the wiring electrodes 15, 16.

Further, the inner electrode for test 28 has two extended terminal portions 28*a* similar to the extended terminal portions 27*a*, and has an intermediate portion 28*b* similar to the intermediate portion 27*a*. The two extended terminal portions 28*a* are extended, similarly to the extended terminal portions 15*a*, from the testing region 18 to the inside of the groove portion 20. Therefore, the two extended terminal portions 28*a* are also partially cut afterward along the groove portion 20, so that later-described respective end faces 28*c* appear. On the end faces 28*c*, later-described outer electrodes for test 65 are formed.

Structure of Laminated Chip Package

By using the semiconductor wafer 1 and the semiconductor wafers 51, 52 having the above-described structure, a laminated chip package 100 can be manufactured. The structure of the laminated chip package 100 will be described as follows.

Figure 20:
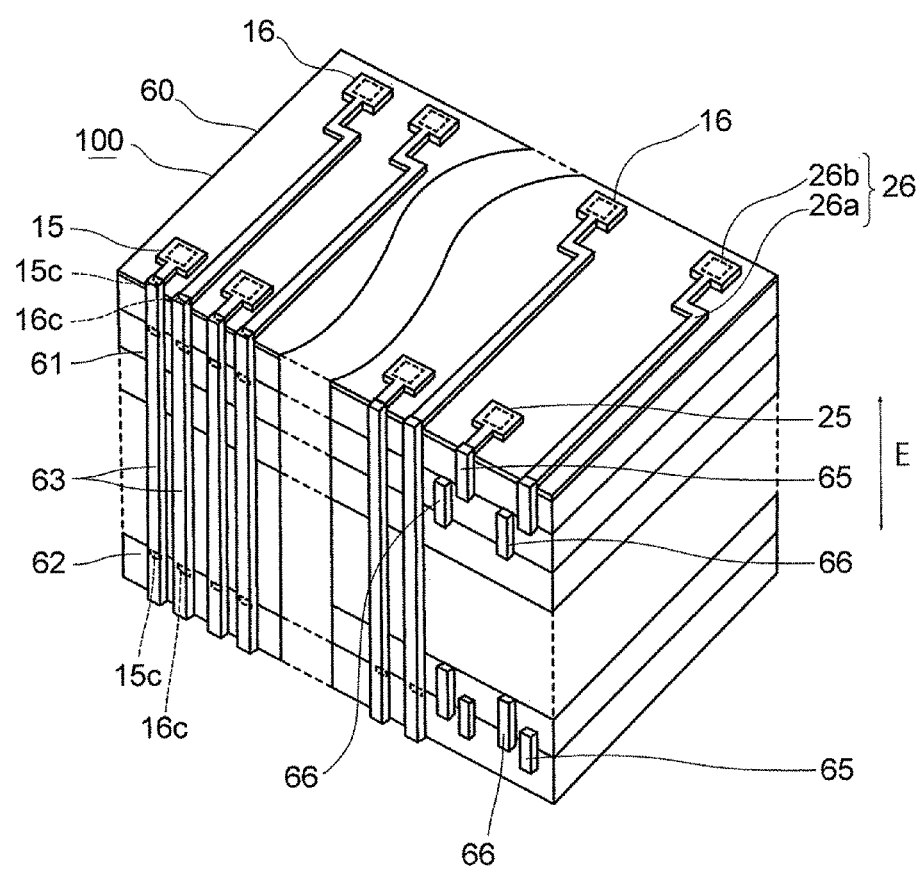
FIG. 20 is a perspective view illustrating an example of the laminated chip package with a part thereof omitted.
Figure 21:
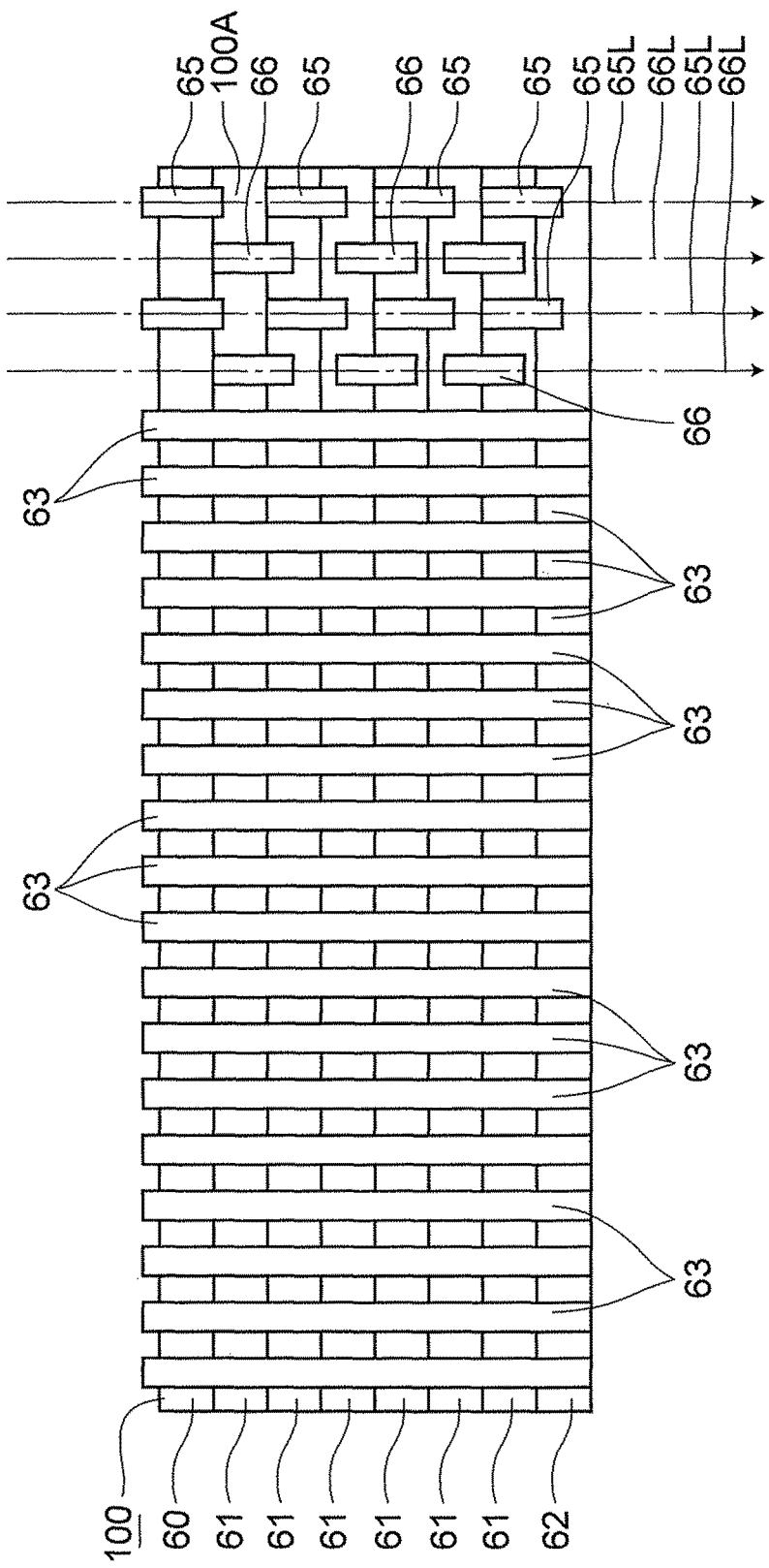
FIG. 21 is a side elevation view of the laminated chip package in FIG. 20.
Figure 22:
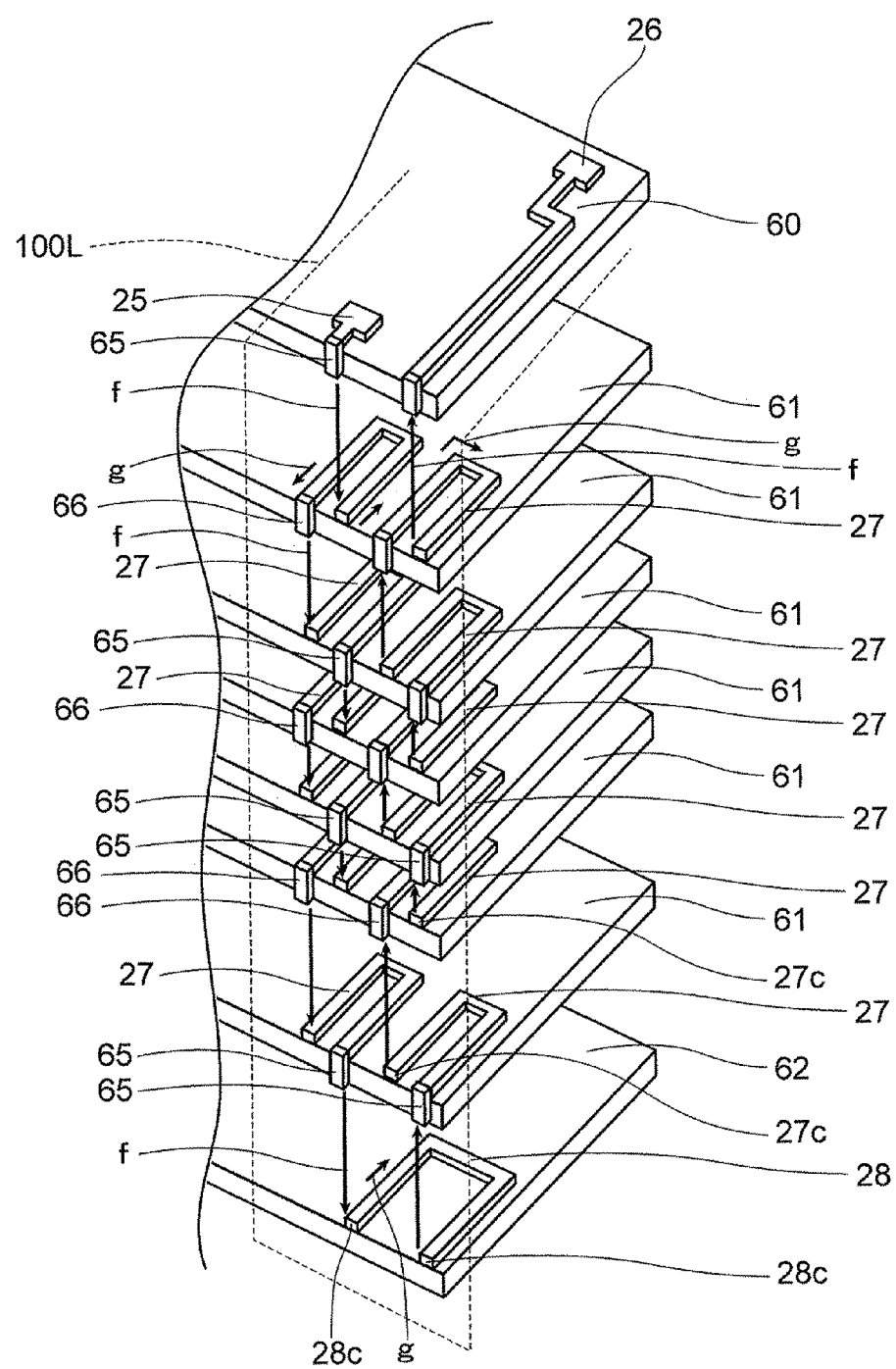
FIG. 22 is a perspective view showing the laminated chip package in FIG. 20 with a part thereof omitted, illustrating all the device plates thereof disassembled.

The laminated chip package 100 has a structure in which one device plate 60, six device plates 61, and one device plate 62 are stacked so that eight device plates in total are laminated as shown in FIG. 20, FIG. 21, and FIG. 22. FIG. 20 is a perspective view showing the laminated chip package 100 with a part thereof omitted, FIG. 21 is a side view of the laminated chip package 100, and FIG. 22 is a perspective view showing the laminated chip package 100 with a part thereof omitted, illustrating all the device plates thereof disassembled. In the laminated chip package 100, the device plate 60 as a surface layer plate is laminated at the uppermost position, the six device plates 61 are laminated under the device plate 60, and the device plate 62 is laminated under the device plates 61.

Further, in the laminated chip package 100, wiring of the device plates 60, 61 and 62 is realized by the connection electrodes 63. In the laminated chip package 100, all of the connection electrodes 63 are formed on the wiring side surface 100A that is one of four side surfaces. This realizes the single-side wiring structure in the laminated chip package 100.

The laminated chip package 100 can realize memories with various storage capacities such as 64 GB (gigabyte), 128 GB, and 256 GB by varying the memory portions in the semiconductor wafer 1, 51, 52. Note that eight device plates are laminated in the laminated chip package 100. However, it is only necessary that a plurality of device plates are laminated, and the number of the laminated device plates is not limited to eight.

In the laminated chip package 100, a plurality of end faces 15*c* and a plurality of end faces 16*c* are formed. Further, connection electrodes 63 are formed to connect all of the end faces 15*c* or 16*c* over the device plates 60, 61, and 62.

Figure 29:
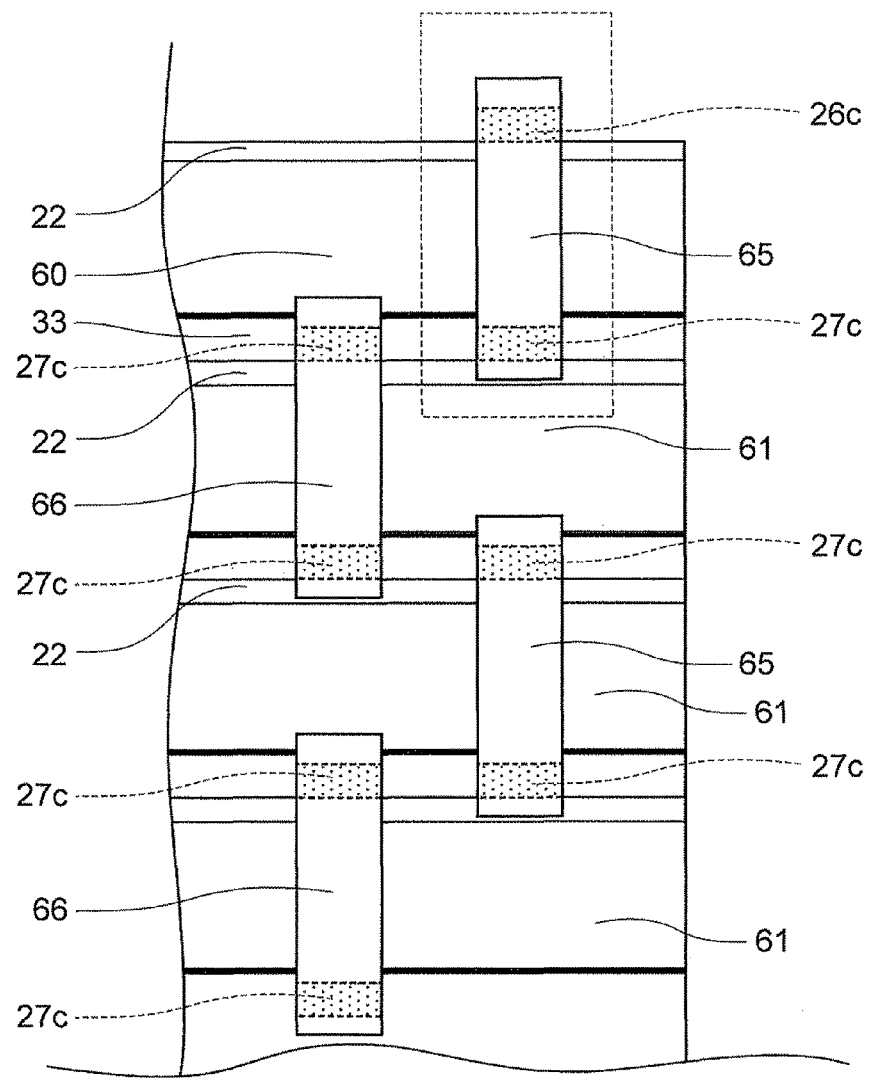
FIG. 29 is a side elevation view illustrating an enlarged essential part of the laminated chip package illustrated in FIG. 21.
Figure 30:
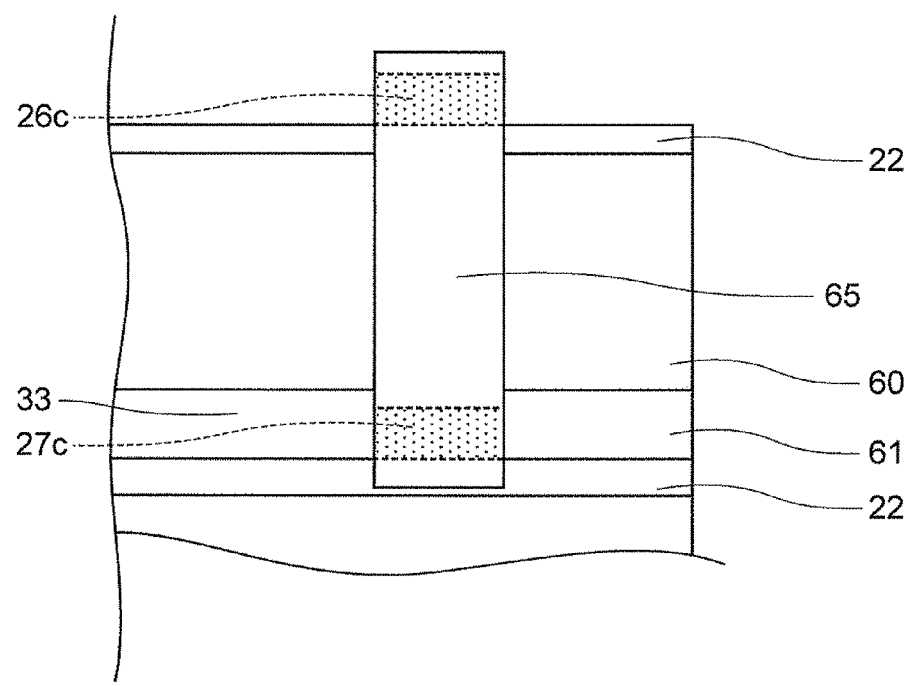
FIG. 30 is a side elevation view of an enlarged essential part of FIG. 29.

Besides, outer electrodes for test 65, 66 are formed on a wiring side surface 100A. The outer electrodes for test 65, 66 are shown in FIG. 29 and FIG. 30 as well as in FIG. 20, FIG. 21, and FIG. 22.

The outer electrodes for test 65, 66 are outer electrodes for examination according to this embodiment, and a plurality of outer electrodes for test 65 and a plurality of outer electrodes for test 66 are formed (eight outer electrodes for test 65 and six outer electrodes for test 66). The outer electrode for test 65, 66 is formed only for two adjacent device plates among the eight device plates 60, 61, and 62 in total, namely, to electrically connect only two adjacent device plates with the other device plates excluded from the target for electrical connection so as not to connect the other device plates. The outer electrodes for test 65, 66 are different from the connection electrode 63 in height and positions where they are formed, but are formed under the common conditions such as a material and a forming method.

Then, each of the outer electrodes for test 65 is formed in one of three connection patterns shown in 1), 2), and 3), that is, a connection pattern A, a connection pattern B, and a connection pattern C, and each of the outer electrodes for test 66 is formed in the connection pattern B shown in 2). Note that a lamination direction E shown in 1), 2), and 3) is a direction in which the device plates 60, 61, and 62 are laminated, meaning a direction of the thickness of the laminated chip package 100.

1) A connection pattern A: A connection pattern in which the end faces 25*c*, 26*c* of the wiring electrodes for test 25, 26 are connected to the end faces 27*c*, 27*c* of the inner electrodes for test 27 formed directly under them in the lamination direction E.

2) A connection pattern B: A connection pattern in which the end faces 27*c*, 27*c* of the inner electrodes for test 27, 27 vertically arranged are connected in the lamination direction E.

3) A connection pattern C: A connection pattern in which the end faces 27*c*, 27*c* of the inner electrodes for test 27 are connected to the end faces 28*c*, 28*c* of the inner electrodes for test 28 formed directly under them in the lamination direction E.

The outer electrode for test 65 is formed in the connection pattern A when it is disposed at the uppermost position and formed in the connection pattern C when it is disposed at the lowermost position. In other cases, it is formed in the connection pattern B. All of the outer electrodes for test 66 are formed in the connection pattern B.

The outer electrodes for test 65, 66 are intermittently arranged out of contact with each other along the lamination direction E so that they are formed to connect different target device plates among the device plates 60, 61, and 62. Besides, in the arrangement of the outer electrodes for test 65, 66 as seen from the device plate 60 toward the device plate 62, the outer electrodes for test 65, 66 alternately appear. Further, outer electrode columns 65L, 66L shown in FIG. 21 are constituted of the plurality of outer electrodes for test 65, 66 arranged along the lamination direction E. In the laminated chip package 100, the outer electrode columns 65L, 66L are formed two each. The outer electrode columns 65L, 66L mean intermittent arrangements of the outer electrodes for test 65, 66 respectively.

Further, the outer electrodes for test 65, 66 will be described in detail with reference to FIG. 29 and FIG. 30 as follows. Note that the wiring electrode for test 26 from among the wiring electrodes for test 25, 26 is shown, and the illustration of the wiring electrode for test 25 is omitted in FIG. 29 and FIG. 30. Further, the end faces 26*c*, 27*c* are dotted for convenience of illustration.

The laminated chip package 100 is manufactured by laminating the semiconductor wafers 51 under the above-described semiconductor wafer 1 (described later for detail). Therefore, the end faces 27*c*, 27*c* are formed directly under the end faces 25*c*, 26*c*. As described above, the wiring electrodes for test 25, 26 have the protruding structure, and therefore the end faces 25*c*, 26*c* are formed as projecting end faces. Meanwhile, the inner electrodes for test 27 also have the protruding structure, and therefore the end faces 27*c*, 27*c* are also formed as projecting end faces. Incidentally, when manufacturing the laminated chip package 100, the semiconductor wafer 51 is boded to the semiconductor wafer 1 using an adhesive (described later for detail). Accordingly, the end faces 27c, 27c are covered by the adhesive layer 33 made of the adhesive used in manufacture, and the end faces 27c, 27c are located below the lower surface of the upper device plate. Similarly, the end faces 28c, 28c are located below the lower surface of the upper device plate.

The outer electrodes for test 65, 66 connect the plural end faces in such a positional relation in the above-described connection patterns, and are therefore formed to have heights along the lamination direction E larger than the thicknesses of the device plates 60, 61, and 62.

On the other hand, in FIG. 22, the connection relation between the wiring electrodes for test 25, 26 and the inner electrodes for test 27, the inner electrode for test 28, the outer electrodes for test 65, 66 is shown.

As described above, the end face 25c of the wiring electrode for test 25 is connected to the end face 27c of the inner electrode for test 27 located directly under it by the outer electrode for test 65. Further, the other end face 27c of the same inner electrode for test 27 is connected to the end face 27c of the inner electrode for test 27 located directly under it by the outer electrode for test 66. Hereinafter, the connection in the connection pattern B of the outer electrodes for test 65, 66 is repeated four times. Then, the connection in the connection pattern C is repeated twice for the lowermost device plate 61 and the device plate 62. Furthermore, the connection in the connection pattern B of the outer electrodes for test 65, 66 is repeated five times, and the connection in the connection pattern A of the outer electrodes for test 65 is finally performed once.

In addition, the inner electrodes for test 27, 28 have the turn structure. Therefore, in the laminated chip package 100, the connections between the end faces by the outer electrodes for test 65, 66 as described above are performed to form a line for test 100L. The line for test 100L is a line for examination according to the embodiment of the present invention, and is constituted of a series of electrodes between the wiring electrode for test 25 and the wiring electrode for test 26 together with the outer electrodes for test 65, 66 and the inner electrodes for test 27, 28 all of which are continuous. In the laminated chip package 100, when current flows from the wiring electrode for test 25, the current reaches the wiring electrode for test 26 passing through the line for test 100L. In other words, the current flows in a direction shown by arrows f and g, passing through all of the inner electrodes for test 27, 28 and the outer electrodes for test 65, 66, and reaches the wiring electrode for test 26.

This line for test 100L can be used for a test to confirm the contact resistance between the wiring electrodes 15, 16 and the connection electrodes 63 in the laminated chip package 100 (referred to also as a resistance confirmation test and will be described later for detail). In this case, the wiring electrode for test 25 has a function as a first wiring electrode for examination, and the wiring electrode for test 26 has a function as a second wiring electrode for examination.

Since the above-described line for test 100L is formed in the laminated chip package 100, the resistance confirmation test can be conducted by bringing a not-shown test device into contact with the wiring electrodes for test 25, 26 and applying a voltage for examination between them. By the resistance confirmation test, the values of the contact resistance between the wiring electrodes for test 25, 26 or the inner electrodes for test 27, 28 and the outer electrodes for test 65, 66, which constitute the line for test 100L, can be obtained. Thus, the wiring electrodes for test 25, 26 have a structure in common with the wiring electrodes 15, 16 and are formed under the conditions in common with the wiring electrodes 15, 16. The inner electrodes for test 27, 28 are formed under the conditions in common with the wiring electrodes 15, 16 though they are different in shape from the wiring electrodes 15, 16. Further, the outer electrodes for test 65 and 66 are formed under the conditions in common with the connection electrode 63. Therefore, the values of the contact resistance between the wiring electrodes 15, 16 and the connection electrodes 63 can be estimated from the obtained values of the contact resistance.

On the other hand, if the obtained value of the contact resistance is abnormal, it can be judged that there is a failure in the contact at some portion in the line for test 100L. In this case, for example, it is possible to bring the test device into contact with the wiring electrode for test 25 and any of the outer electrodes for test 66 and conduct the resistance confirmation test again. Further, it is also possible to bring the test device into contact with the outer electrode for test 65 and the outer electrode for test 66 and conduct the resistance confirmation test.

Besides, both of the outer electrodes for test 65, 66 are provided only for two adjacent device plates among the device plates 60, 61, and 62. This also makes it possible to conduct the resistance confirmation test only on a part of the device plates 60, 61, and 62 even though the device plates 60, 61, and 62 are laminated at eight layers in the laminated chip package 100. The resistance confirmation test only on a part of the laminated device plates is referred to also as an individual test.

The laminated chip package 100 has a structure in which the resistance confirmation test on all of the device plates 60, 61, and 62 and the individual test are easily conducted and a structure in which the contact resistance between the device plates is easily confirmed. Therefore, for the laminated chip package 100, the process of the resistance confirmation test can be simplified, and the time required for the resistance confirmation test can be reduced. This makes it possible to reduce the manufacturing time of the laminated chip package 100 and increase the number of laminated chip packages 100 which can be manufactured in a unit time. Consequently, the unit manufacturing cost of the laminated chip packaged can be reduced.

Method of Manufacturing Laminated Chip Package

Subsequently, the method of manufacturing the laminated chip package 100 having the above-described structure will be described using FIG. 14 to FIG. 17 as follows.

Figure 14:
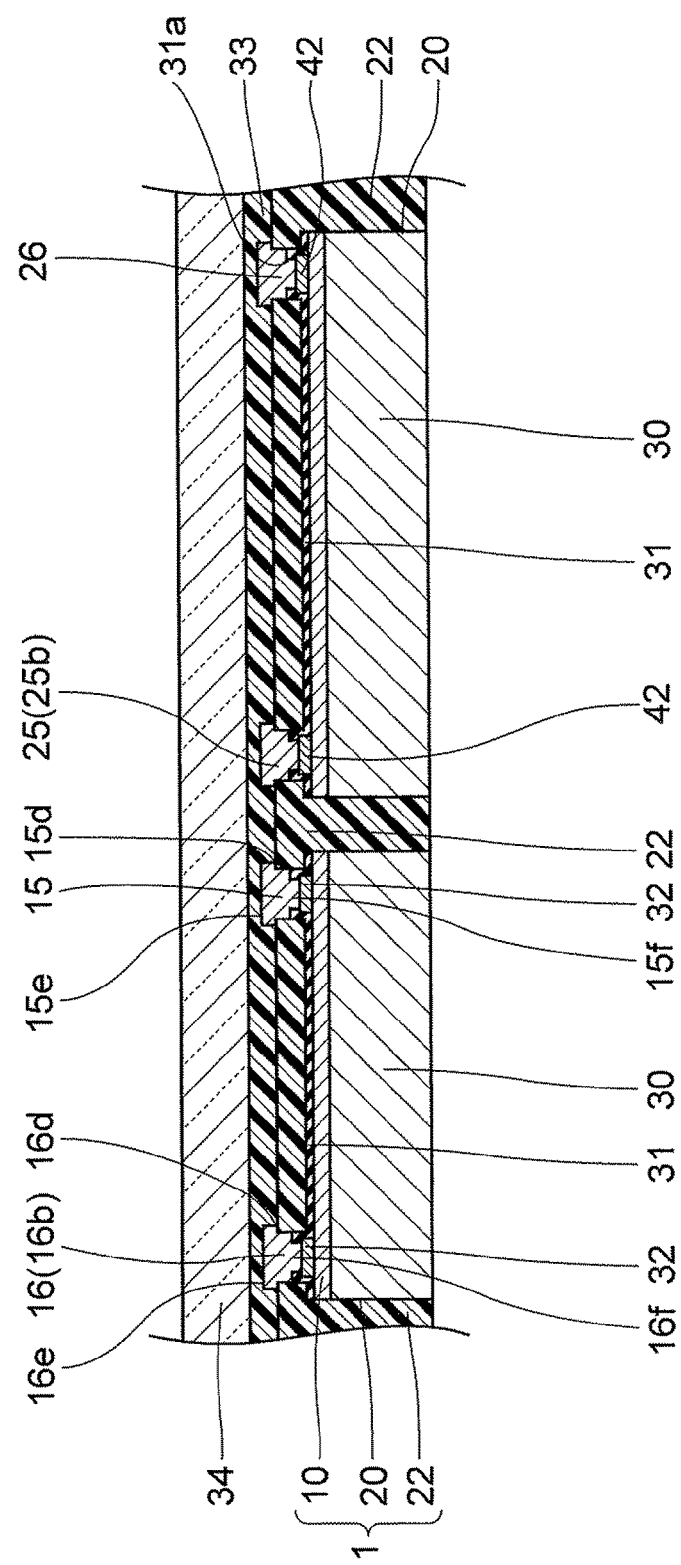
FIG. 14 is a sectional view similar to FIG. 3, illustrating the semiconductor wafer in the process of manufacturing a laminated chip package and a base.
Figure 15:
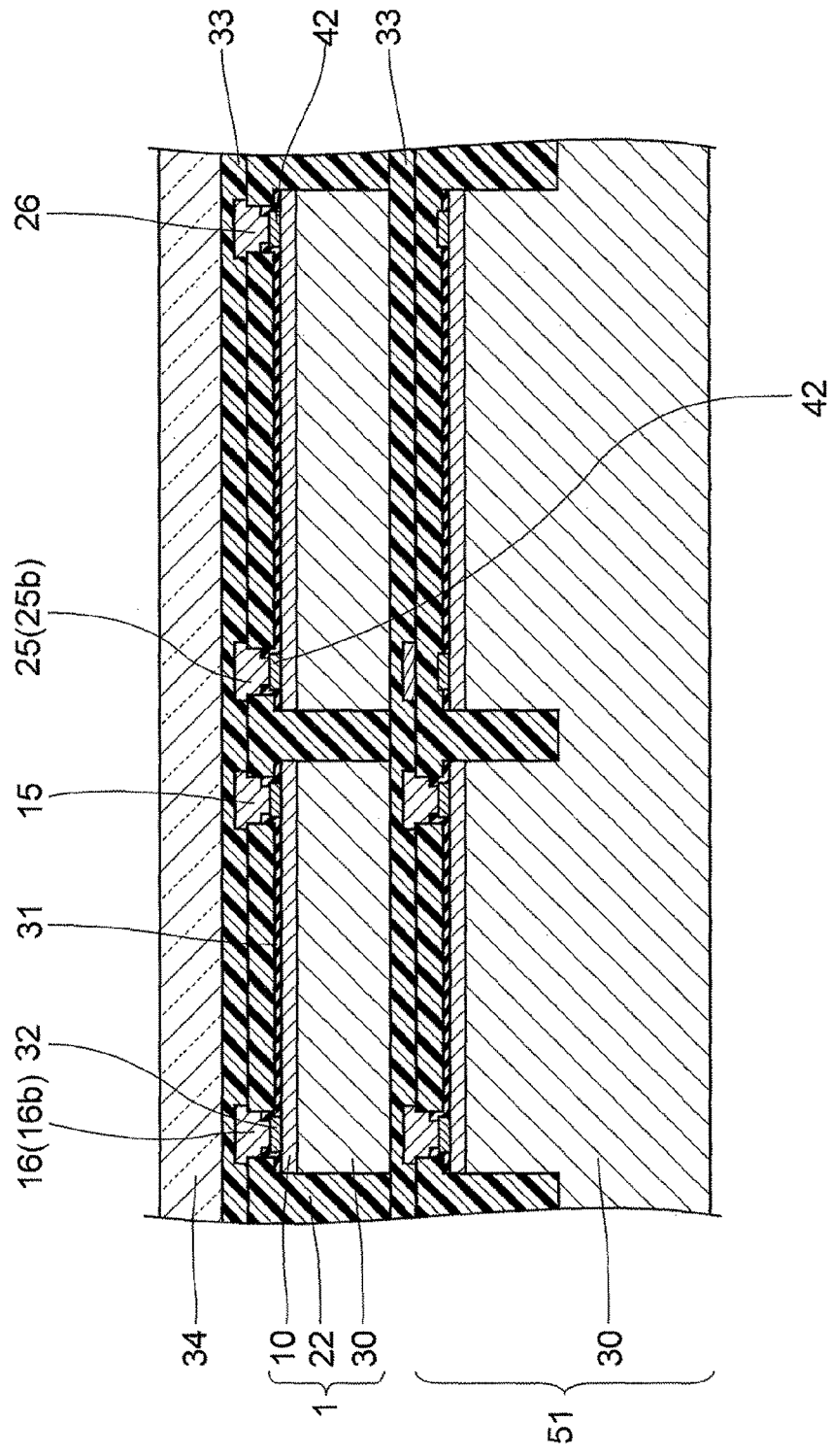
FIG. 15 is a sectional view similar to FIG. 3, illustrating the process subsequent to that in FIG. 14.
Figure 16:
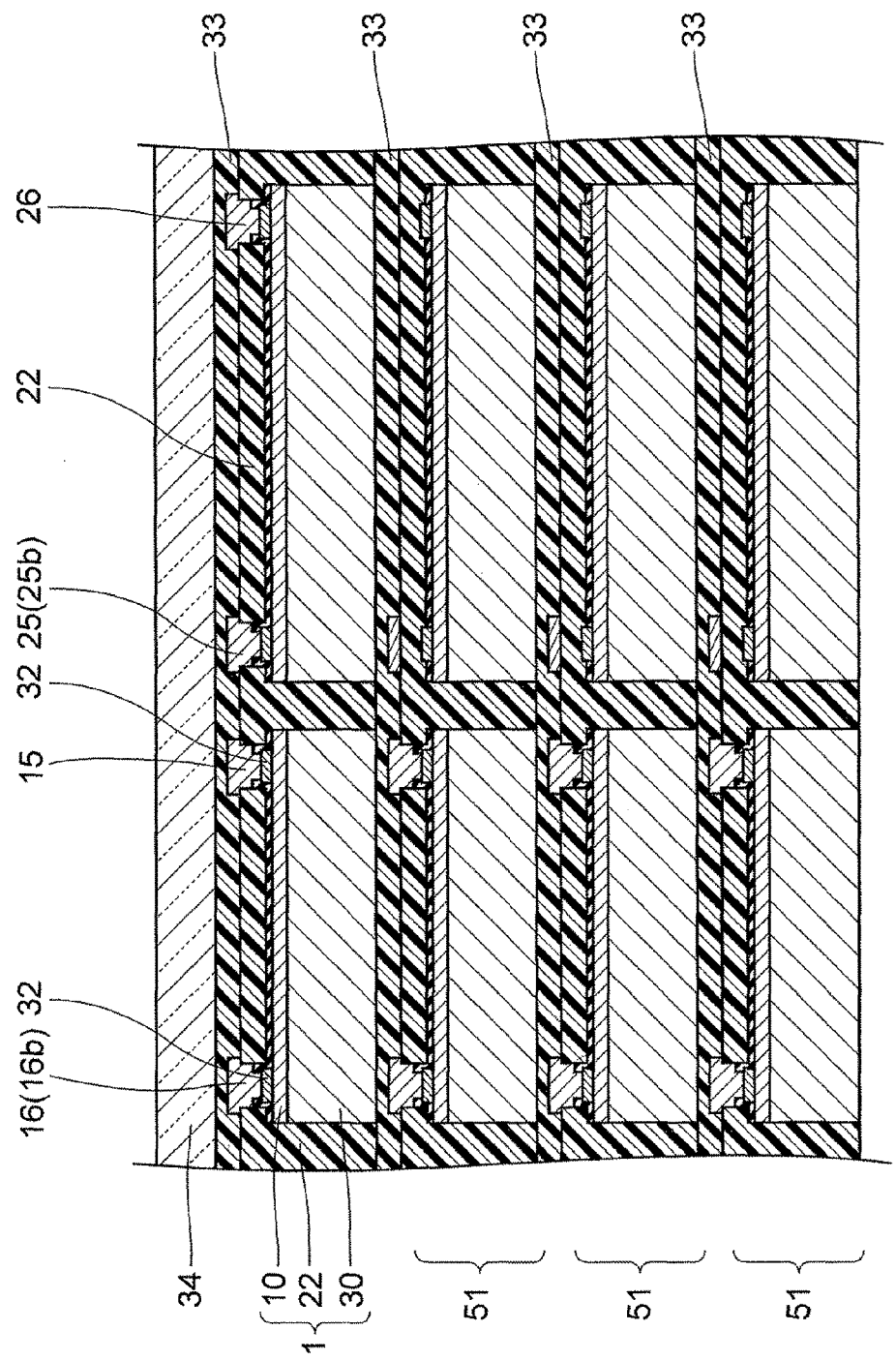
FIG. 16 is a sectional view similar to FIG. 3, illustrating the process subsequent to that in FIG. 15.
Figure 17:
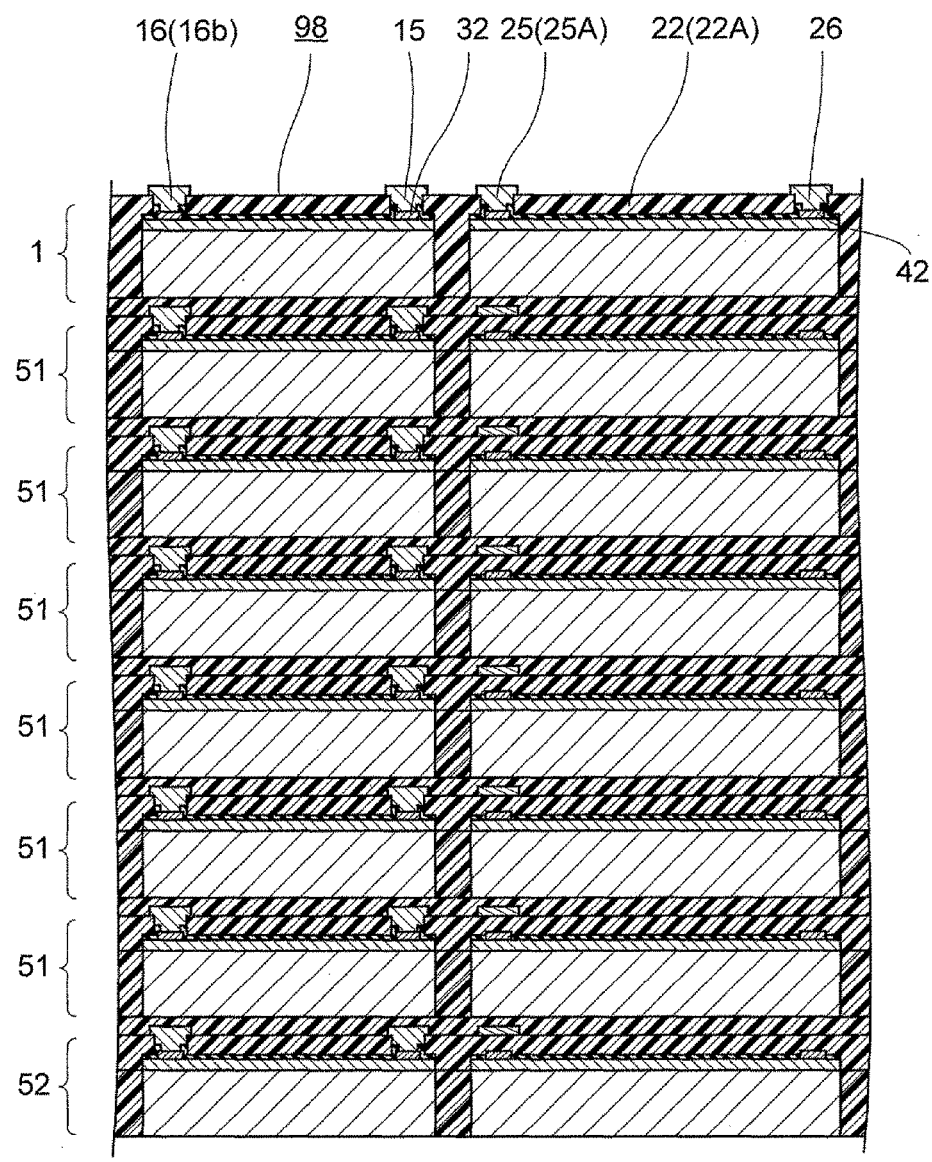
FIG. 17 is a sectional view similar to FIG. 3, illustrating the process subsequent to that in FIG. 16.

Here, FIG. 14 is a sectional view similar to FIG. 3, illustrating the semiconductor wafer 1 in the process of manufacturing the laminated chip package 100 and a base 34. FIG. 15 is a sectional view similar to FIG. 3, illustrating the process subsequent to that in FIG. 14. FIG. 16 is a sectional view similar to FIG. 3, illustrating the process subsequent to that in FIG. 15, and FIG. 17 is a sectional view similar to FIG. 3, illustrating the semiconductor wafer 1, 51, 52 in the process subsequent to that in FIG. 16.

The laminated chip package 100 is manufactured as follows. First, a substrate manufacturing process is performed to manufacture the semiconductor wafer 1 being the substrate without inner electrode and the semiconductor wafers 51 and 52 being the substrates with inner electrode.

Then, a lamination process of manufacturing the laminated device wafer is performed. In this lamination process, an adhesive is applied first on the first surface 1a to fix the semiconductor wafer 1 to the base 34. In FIG. 14, the adhesive layer 33 made of the adhesive applied this time is shown. The semiconductor wafer 1 is used as the uppermost substrate to be located at the uppermost position of a later-described laminated device wafer 98. The base 34 is a member for supporting the semiconductor wafer 1 and a glass plate is used in FIG. 14. Subsequently, polishing is performed on the second surface 1b of the semiconductor wafer 1 until the groove portions 20, 21 appear to reduce the thickness of the semiconductor wafer 1 as shown in FIG. 14.

Next, the semiconductor wafer 51 is bonded to the second surface 1b side of the semiconductor wafer 1 as illustrated in FIG. 15 using an adhesive. In this event, position adjustment of the semiconductor wafer 1 and the semiconductor wafer 51 is performed such that the positions of the groove portions 20 and 21 of both of them coincide with each other. Then, the second surface 1b of the semiconductor wafer 51 is polished until the groove portions 20 and 21 appear. This polish decreases the thickness of the semiconductor wafer 51 to thereby obtain a laminated device wafer. In the laminated device wafer, the semiconductor wafer 1 and the semiconductor wafer 51 are laminated.

Further, as illustrated in FIG. 16, other semiconductor wafers 51, 51 are prepared. Then, for each of the semiconductor wafers 51 and 51, a process of bonding it to the second surface 1b side of the laminated device wafer and polishing it (a bonding and polishing process) is performed.

Continuously, the bonding and polishing process is repeatedly performed for other semiconductor wafers 51. As a result, the bonding and polishing process is performed for the six semiconductor wafers 51 in total. Then, the bonding and polishing process is performed for the semiconductor wafer 52 as shown in FIG. 17.

Thereafter, when the base 34 and the adhesive layer 33 are removed, the laminated device wafer 98 as shown in FIG. 17 is manufactured. In the laminated device wafer 98, the semiconductor wafer 1 is placed at the uppermost position, and the six semiconductor wafers 51 and the one semiconductor wafer 52 are stacked thereunder, so that the eight semiconductor wafers in total are laminated. In the laminated device wafer 98, the wiring electrodes 15, 16 and the wiring electrodes for test 25, 26 of the semiconductor wafer 1 appear in the protruding shape because the base 34 and the adhesive layer 33 have been removed.

Figure 19:
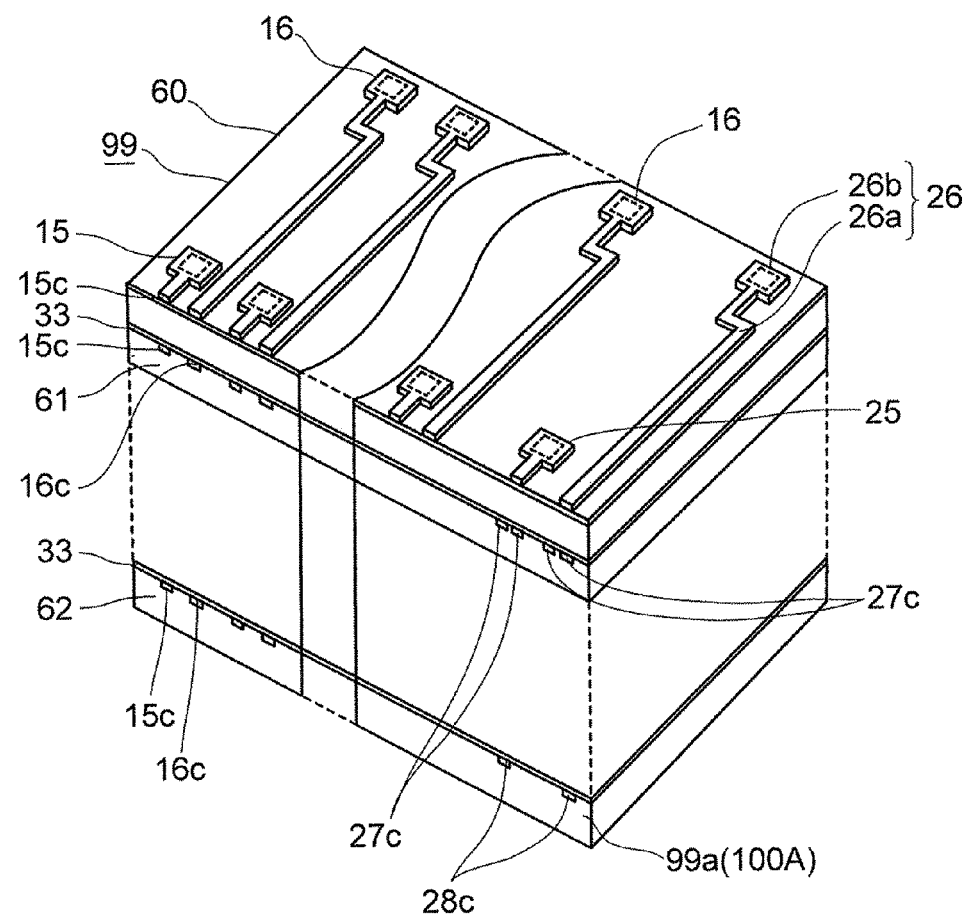
FIG. 19 is a perspective view illustrating an example of a device block.

Subsequently, a block manufacturing process is performed. In this block manufacturing process, the laminated device wafer 98 is cut along the groove portions 20 and 21. Thus, a device block 99 in a rectangular parallelepiped shape is obtained as illustrated in FIG. 19. FIG. 19 is a perspective view illustrating the device block 99. One of four side surfaces of the device block 99 is a wiring side surface 99a. At the wiring side surface 99a, later-described end faces 15c and 16c of the extended terminal portions 15a and 16a appear to project outward from the surface 22c of the surface insulating layer 22. Besides, later-described end faces 25c and 26c of the extended terminal portions 25a and 26a appear to project outward from the surface 22c. Further, a plural pair of the end surface 27c, 27c of the extended terminal portions 27a appear, one pair of the end surface 28c, 28c of the extended terminal portions 28a appears. The end surface 27c, 27c and the end surface 28c, 28c appear to project outward from the surface 22c.

Then, an outer electrode forming process is performed to form the outer electrodes for test 65, 66 and the connection electrodes 63 under the common conditions on the wiring, side surface 99a as shown in FIG. 20. As a result, the laminated chip package 100 is manufactured. The connection electrodes 63 are formed in a band shape on the wiring side surface 100A to connect the vertically arranged plural end faces 15c or the vertically arranged plural end faces 16c. The outer electrodes for test 65, 66 are formed to connect the end faces 25c, 26c of the wiring electrodes for test 25, 26 or the end faces 27c, 28c of the inner electrodes for test 27, 28 in the lamination direction E only for two adjacent device plates among the laminated device plates. In this event, two of the outer electrodes for test 65 are formed to connect the end faces 25c, 26c and the end faces 27c, 28c along the lamination direction E, and the other outer electrodes for test 65 are formed to connect the end faces 27c, 28c of the inner electrodes for test 27, 28 along the lamination direction E.

The laminated chip package 100 is manufactured by forming the connection electrodes 63 on the wiring side surface 99a. The end faces 15c and 16c connected by the connection electrodes 63 are formed in a manner to project upward from the surface 22c.

At the time of forming the connection electrodes 63, the mask pattern for forming the connection electrodes 63 needs to be accurately placed, but the laminated chip package 100 can be manufactured even if the position adjustment of the mask pattern is roughly performed. Even with the rough position adjustment, the connection electrodes 63 connecting the vertically arranged plural end faces 15c or the vertically arranged plural end faces 16c can be formed.

More specifically, in the laminated chip package 100, the alignment does not need to be performed with high accuracy when forming the connection electrodes 63. Therefore, the process after the device block 99 in the rectangular parallelepiped shape is obtained can be simplified, thereby simplifying the whole manufacturing process of the laminated chip package 100. Accordingly, the manufacturing time of the laminated chip package 100 can be reduced. This can increase the number of laminated chip packages 100 manufacturable in a unit time, resulting in a reduced manufacturing cost of the laminated chip package 100.

The reason why the alignment does not need to be performed with high accuracy when forming the connection electrodes 63 is given as follows.

First of all, the device block 99 has four side surfaces composed of cut surfaces when the laminated device wafer 98 is cut. In one of the cut surfaces, the end faces 15c and 16c appear as end faces projecting similarly to the end faces 15g and 16g (see FIG. 11 for details). This is because of the following reason. Note that the end face projecting is also referred to as a projecting end face in this embodiment.

The wiring electrodes 15 and 16 of each of the semiconductor wafers 1 (also the semiconductor wafer 51, 52) have the extended terminal portions 15a and the extended terminal portions 16a respectively. The extended terminal portions 15a and the extended terminal portions 16a are extended inside the groove portions 20. For this reason, when the laminated device wafer 98 is cut along the groove portions 20 and 21, the extended terminal portions 15a and the extended terminal portions 16a are also cut. Further, the end faces 15c and 16c formed when the extended terminal portions 15a and the extended terminal portions 16a are cut appear at one of the cut surfaces.

On the other hand, the extended terminal portions 15a and 16a are formed in the protruding shape similarly to the electrode pads 15b and 16b having the expanded height h15. Therefore, the end faces 15c and 16c appear as projecting end faces projecting upward from the surface 22c.

For the connecting pads 32, a case where terminal portions extending to the inside of the groove portion 20 are formed is discussed here (the terminal portions are referred to as virtual terminal portions). In this case, end faces of the virtual terminal portions will appear at the side surface of the device block.

However, the extended terminal portions 15a and 16a have top end faces 15e and 16e common with the electrode pads 15b and 16b having the expanded height h15 and are formed to be larger in thickness than the connecting pads 32. For this reason, the end faces 15c and 16c will appear having a larger size than the end faces of the above-described virtual terminal portions. In the device block 99, the end faces 15c and 16c having such a large size appear arranged in the vertical direction, so that the end faces 15c are easily connected to each other and the end faces 16c are also easily connected to each other. It is only necessary for the connection electrodes 63 to connect the end faces 15c or the end faces 16c. Therefore, the position adjustment of the mask pattern may be roughly performed at the time when the connection electrodes 63 are formed. For this reason, the alignment does not need to be performed with high accuracy when forming the connection electrodes 63 in the device block 99.

Besides, the large size of the end faces 15c and 16c means that the sectional areas of the wiring electrodes 15 and 16 have been expanded. Accordingly, the resistance values of the wiring electrodes 15 and 16 can be decreased. This causes the current flowing through the wiring electrodes 15 and 16 to easily flow, so that the power consumption of the laminated chip package 100 can also be reduced.

Thus, the semiconductor wafer 1 has the wiring electrodes 15 and 16 as described above, whereby the manufacturing process of the laminated chip package 100 can be simplified to reduce the manufacturing time.

Further, the device block 99 has the electrode pads 15b and 16b rising above in the protruding shape appearing at its upper surface. When pad-like terminals rising above the surface of the insulating layer are required, the laminated chip package needs to be manufactured by stacking the terminal layer including such pad-like terminals (such a terminal layer is an interposer having no semiconductor device).

However, in the device block 99, the device plate 60 having the electrode pads 15b and 16b rising above in the protruding shape is laminated at the uppermost position. Therefore, it is unnecessary to stack the interposer. Therefore, the terminal layer is not necessary, so that the laminated chip package 100 has a compact structure with an accordingly smaller height.

Further, because the semiconductor wafer 1 has the extended terminal portions 15a and 16a extending inside the groove portions 20, the end faces 15c and 16c can appear at the cut surfaces when the laminated device wafer is cut along the groove portions 20. In other words, by cutting the laminated device wafer 98, in which the semiconductor wafers 1 are laminated, along the groove portions 20, the end faces 15c and 16c can be obtained.

Therefore, it is unnecessary, when using the semiconductor wafer 1, to expressly provide another process in order to make the wirings connecting to the device regions 10 appear at the cut surfaces. If the wiring electrodes 15 and 16 do not have the extended terminal portions 15a and 16a, the wiring electrodes 15 and 16 cannot be cut even by cutting the laminated device wafer along the groove portions 20. Therefore, only by cutting the laminate device wafer along the groove portions, the wirings connecting to the device regions 10 cannot be made to appear at the cut surfaces. Thus, in order to make such wirings appear at the cut surfaces, another process needs to be performed.

In contrast, in the case of using the semiconductor wafer 1, the end faces of the wiring electrodes 15 and 16 can be made to appear at the cut surfaces when the laminated device wafer is cut along the groove portions, and therefore it is unnecessary to expressly perform a process for making the wirings appear at the cut surfaces. Consequently, the manufacturing process of the laminated chip package can be further simplified by using the semiconductor wafer 1.

Further, the wiring electrodes 15 and 16 are formed to rise above the surface insulating layer 22. Therefore, when the end faces 15c and 16c appear at the cut surface, the end faces 15c located one above the other are arranged via the surface insulating layer 22 and the end faces 16c located one above the other are arranged via the surface insulating layer 22. Accordingly, a situation that the device plates located one on the other short-circuit can be prevented.

Further, the wiring electrodes 15 and 16 in the semiconductor wafer 1 form the wiring electrode group 17, and the wiring electrode group 17 has an unevenly distributed structure in which the wiring electrodes 15 and 16 are unevenly distributed at a part of the groove portions 20 and 21 which are in contact with the device region 10. This ensures that when the laminated chip package 100 is manufactured using the semiconductor wafer 1, the wiring connecting to the device region 10 can be placed closely to a single side surface to realize the single side surface wiring of the laminated chip package 100.

Consequently, the semiconductor wafer 1 is suitable for manufacturing the laminated chip package 100 which can realize the single side surface wiring. Further, an inspection to examine presence or absence of a defective chip needs to be performed only on part of the cut surfaces of the semiconductor wafer 1. Accordingly, the process of manufacturing the laminated chip package could be further simplified by using the semiconductor wafer 1.

In addition, because the extended terminal portions 15a and 16a have a narrow-width structure having narrower widths than those of the electrode pads 15b and 16b, many wiring electrodes 15 and 16 can be arranged in the device region 10. Accordingly, the wiring density of the wiring electrodes 15 and 16 can be increased in the semiconductor wafer 1. Furthermore, the memory portions of each device region 10 are formed on the same plane in the semiconductor wafer 1, so that the alignment error is 0 (zero).

Meanwhile, the device block 99 has a structure that the device plates 61, 62 illustrated in FIG. 19 are laminated under the device plate 60 illustrated in FIG. 18.

In the device block 99, the end faces 15c and 16c appear at the side surface for wiring 99a being one of the side surfaces of the device block 99. The side surface for wiring 99a is a cut surface when the laminated device wafer 98 is cut along the groove portions 20 and 21.

Structure of Device Plate

The device plate 60 is formed as a whole in a thin rectangular plate shape as illustrated in FIG. 18, FIG. 22, and its four side surfaces are covered by the insulating layer. This insulating layer is formed by cutting the semiconductor wafer 1 along the groove portions 20 and 21, and therefore is made of the same resin as that of the in-groove insulating portions 22a. The device plate 60 is disposed at the uppermost position. Therefore, the device plate 60 has a function of a surface layer plate constitutes a surface layer of the laminated chip package 100.

Further, in the device plate 60, the flat surface on one side is the surface 22c of the surface insulating layer 22, and the plural three-dimensional wiring electrodes 15 and three-dimensional wring electrodes 16 rising above the surface 22c are formed. Besides, wiring electrodes for test 25, 26 are formed into a three-dimensional shape too. The end faces 15c, 16c of the wiring electrodes 15, 16 and the end faces 25c, 26c of the wiring electrodes for test 25, 26 appear as projecting end faces at a side surface 60A being one of the four side surfaces. The end faces 15c and 16c can be connected to the connection electrodes 63. The end faces 25c and 26c can be connected to the outer electrodes for test 65, 66. The surface insulating layer 22 of the device plate 60 constitutes its own surface layer, and constitutes the surface layer of the laminated chip package 100.

The device plate 61 is different from the device plate 60 in that the device plate 61 has the adhesive layer 33 and inner electrodes for test 27. Note that illustration of the adhesive layer 33 is omitted in the FIG. 22.

The device plate 61 is laminated under the device plate 60 via the adhesive layer 33. In the device plate 61, the end faces 15c and 16c of the wiring electrodes 15 and the wiring electrodes 16 are formed as projecting end faces projecting outward from the surface 22c of the surface insulating layer 22 below the end faces 15c and 16c of the device plate 60. Besides, the end faces 27c and 27c of the inner electrodes for test 27 are formed as projecting end faces below the end faces 25c and 26c of the device plate 60.

The device plate 62 is different from the device plate 61 in that the device plate 62 has a inner electrode for test 28 in place of the inner electrodes for test 27. Besides, in the device plate 62, the end faces 28c and 28c of the testing inner electrode 28 are formed as projecting end faces below the end faces 27c and 27c of the device plate 61.

Second Embodiment

Structures of Laminated Chip Package

Figure 23:
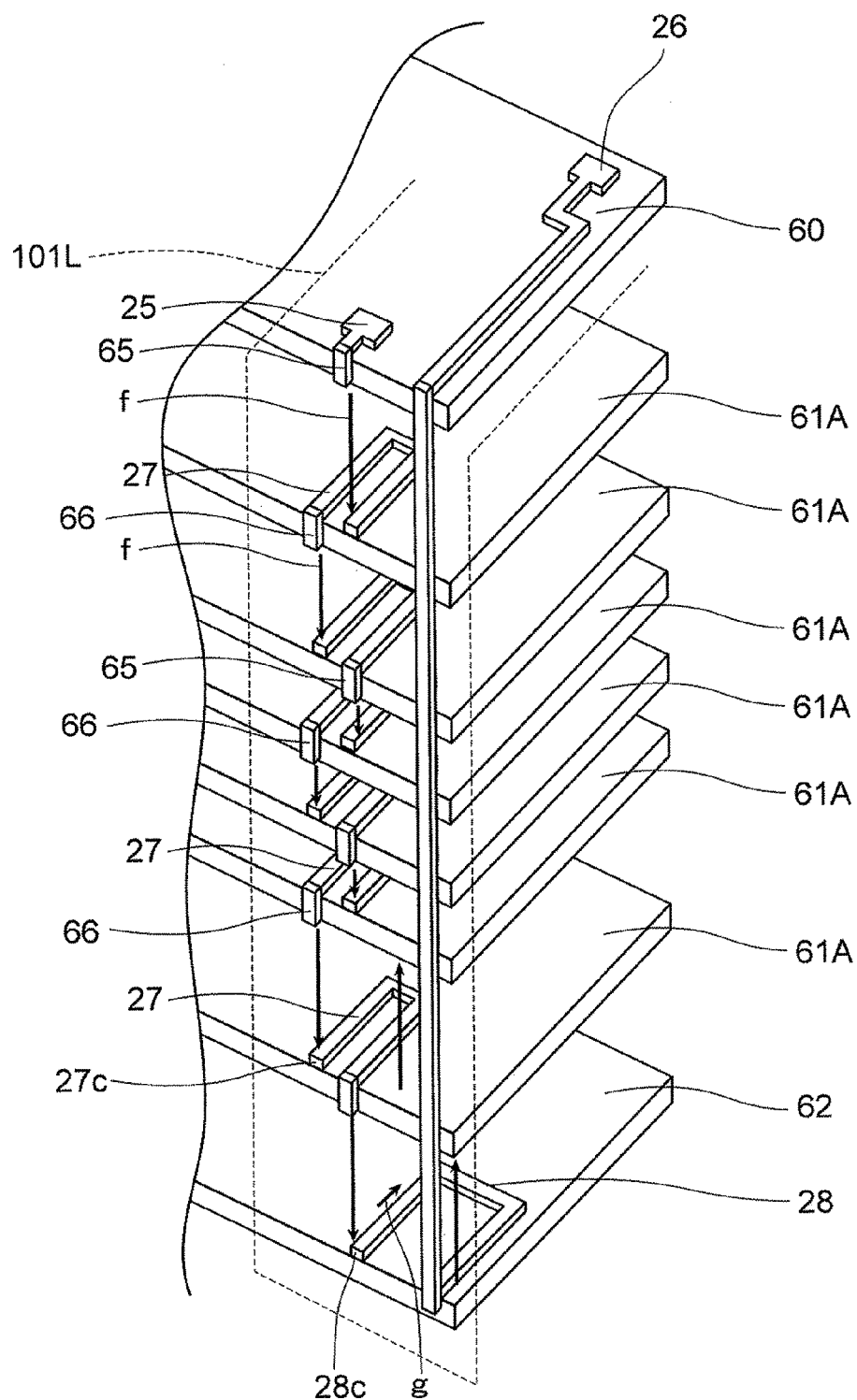
FIG. 23 is a perspective view showing another laminated chip package with a part thereof omitted, illustrating all the device plates thereof disassembled.
Figure 24:
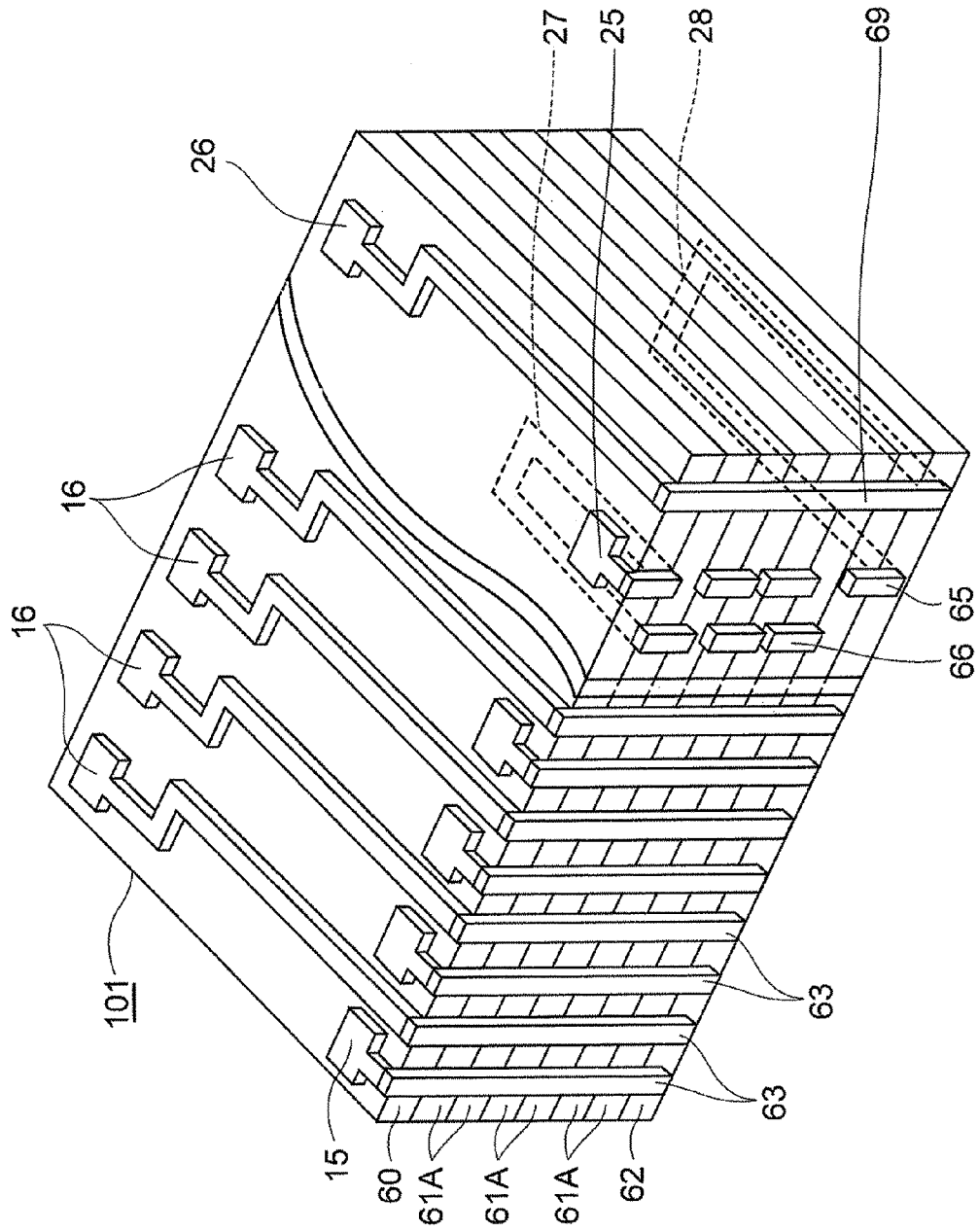
FIG. 24 is a perspective view of the laminated chip package in FIG. 23.

Next, a laminated chip package 101 will be described with reference to FIG. 23 and FIG. 24. FIG. 23 is a perspective view showing the laminated chip package 101 with a part thereof omitted, illustrating all the device plates thereof disassembled. FIG. 24 is a perspective view showing the laminated chip package 101. The laminated chip package 101 is different from the laminated chip package 100 in the following points a, b, and c and is common with it in the other points:
a) the point that six device plates 61A are laminated in place of the six device plates 61;
b) the point that the outer electrode columns 65L and 66L are formed one each; and
c) the point that an outer electrode for test 69 is formed.

The device plate 61A is different from the device plate 61 in that only one inner electrode for test 27 is formed, but has a common structure in other points. The outer electrode for test 69 is an outer electrode for examination according to this embodiment, and is formed only for two device plates disposed at the outermost positions among the eight device plates 60, 61A, and 62 in total. The outer electrode for test 69 is formed to electrically connect the device plates 60 and 62 which are disposed at the outermost positions but not connect the other device plates. The outer electrode for test 69 connects the end face 26c formed on the device plate 60 to the end face 28c formed on the device plate 62.

In such a laminated chip package 101, the connections similar to those of the laminated chip package 100 by the outer electrodes for test 65, 66 are repeated, and then the connection by the outer electrode for test 69 is made. Thus, a line for test 101L is formed in the laminated chip package 101.

The line for test 101L is a line for examination according to this embodiment, similar to the line for test 100L, and is a line of series of electrodes between the wiring electrode for test 25 and the wiring electrode for test 26 together with the outer electrodes for test 65, 66, 69 all of which are continuous in one body. In the laminated chip package 101, when current flows from the wiring electrode for test 25, the current flows in a direction shown by arrows f and g, passing through all of the inner electrodes for test 27, 28 and the outer electrodes for test 65, 66, 69, and reaches the wiring electrode for test 26. Therefore, the line for test 101L can be used for the resistance confirmation test on the laminate chip package 101, similarly to line for test 100L. Accordingly, the resistance confirmation test similar on the laminated chip package 100 can be conducted also on the laminated chip package 101. Consequently, the laminated chip package 101 has a structure in which the resistance confirmation test and the individual test are easily conducted as in the laminated chip package 100, so that the contact resistance between the device plates can be easily confirmed and therefore the time required for the resistance confirmation test can be reduced.

Other Embodiments of Semiconductor Wafer

Figure 25:
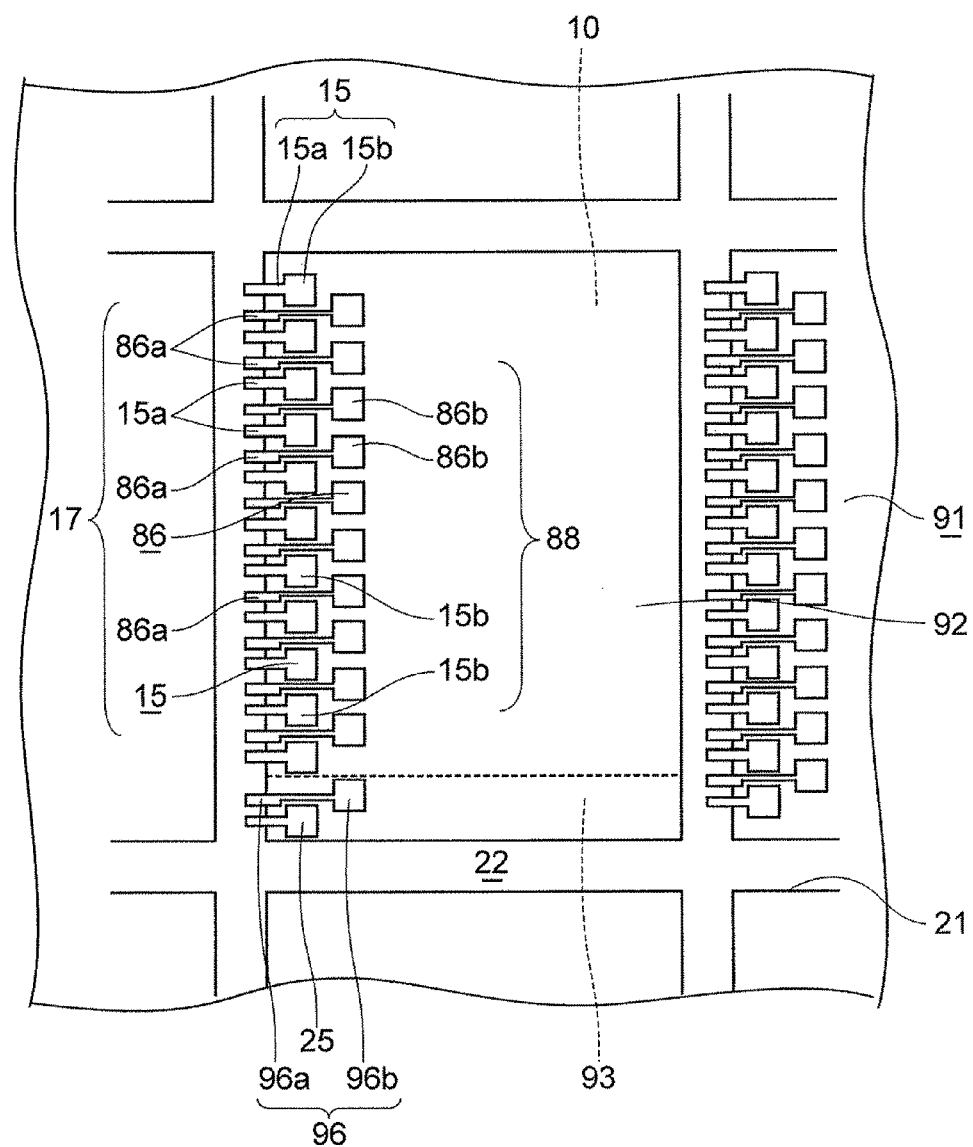
FIG. 25 is a plan view illustrating a device region and a testing region and a region surrounding them formed in the semiconductor wafer according to another embodiment of the present invention.

The laminated chip package 100 can be manufactured by using a semiconductor wafer 91 in place of the semiconductor wafer 1. The structure of a semiconductor wafer 91 will be described with reference to FIG. 25

The semiconductor wafer 91 according to this embodiment is different in that it has a device region 92, a testing region 93 in place of the device region 10, the testing region 18 and that it has wiring electrodes 86 in place of the wiring electrodes 16, and that it has wiring electrodes for test 96 in place of the wiring electrodes for test 26 as compared with the semiconductor wafer 1.

The device region 92 is different from the device region 10 in that the wiring electrodes 86 are formed as well as the wiring electrodes 15. The testing region 93 is different in that it has the wiring electrodes for test 96 as compared with the testing region 18.

The wiring electrode 86 is made of a conductive material such as Cu or the like, and has an extended terminal portion 86a and a rectangular electrode pad 86b. The extended terminal portion 86a and the electrode pad 86b of the wiring electrode 86 are formed along a part of the outer periphery of the device region 92 and the testing region 93, similarly to the wiring electrode 15. Thus, in the device region 92, the wiring electrodes 15 and 86 form the same wiring electrode group 17 as in the device region 10, and additionally, all of their electrode pads 15b and 86b are gathered to a single side of the device region 92 and the testing region 93. In such a manner, the wiring electrodes 15 and 86 form a gathered pad group 88 in the device region 92.

The wiring electrodes for test 96 are different from the wiring electrodes for test 26 in that the wiring electrodes for test 96 are formed along a part of the outer periphery of the device region 92 and the testing region 93.

In the semiconductor wafer 1 according to the first embodiment, the extended terminal portion 16a of the wiring electrode 16 and the extended terminal portion 26a of the wiring electrode for test 26 are formed across the device region 10. Therefore, a certain length of the extended terminal portion 16a, 26a needs to be secured in the semiconductor wafer 1.

On the other hand, in the semiconductor wafer 91, the extended terminal portions 86a, 96a are formed along a part of the outer periphery of the device region 92 and testing region 93, so that the length of the extended terminal portion 86a, 96a can be made smaller than that of the extended terminal portion 16a, 26a. In the semiconductor wafer 91, the length of the extended terminal portion 86a, 96a are reduced to allow more quick access to the device region 92. Further, the amount of plating or the like required for forming the wiring electrodes 86, the wiring electrodes for test 96 can be reduced as compared to the case of forming the wiring electrodes 16, the wiring electrodes for test 26, resulting in a reduced cost.

In addition, the semiconductor wafer 91 can be used to simplify the manufacturing process of the laminated chip package which can realize the single side surface wiring, as with the semiconductor wafer 1.

Other Embodiments

Figure 26:
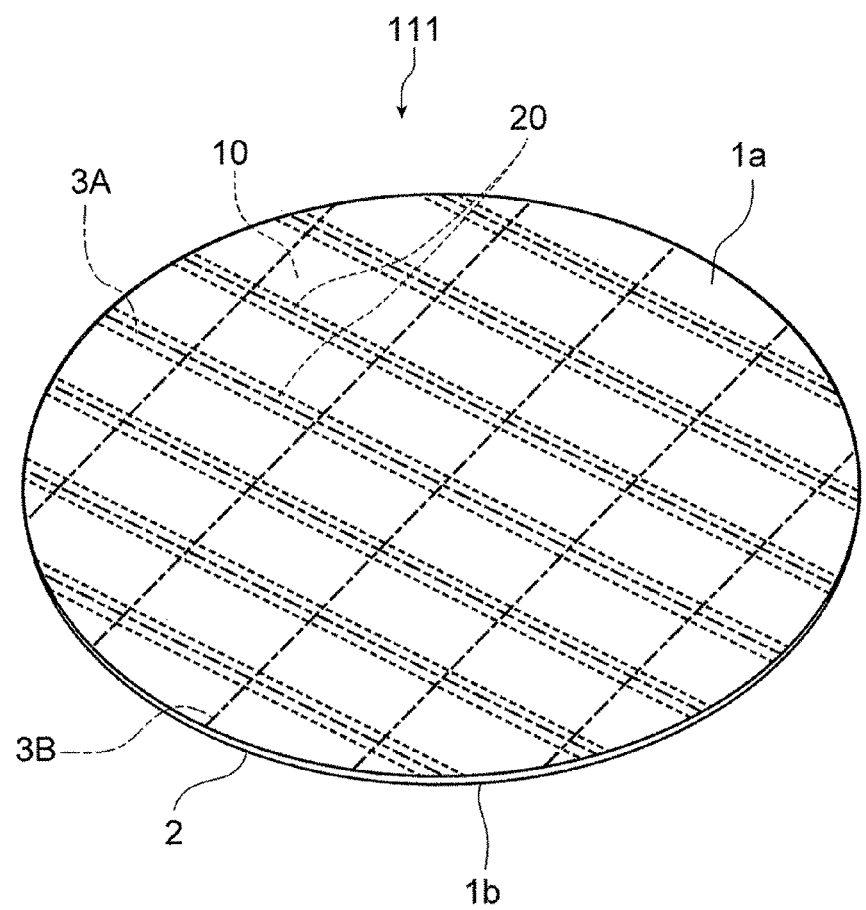
FIG. 26 is a perspective view illustrating the entire semiconductor wafer according to another embodiment of the present invention.
Figure 27:
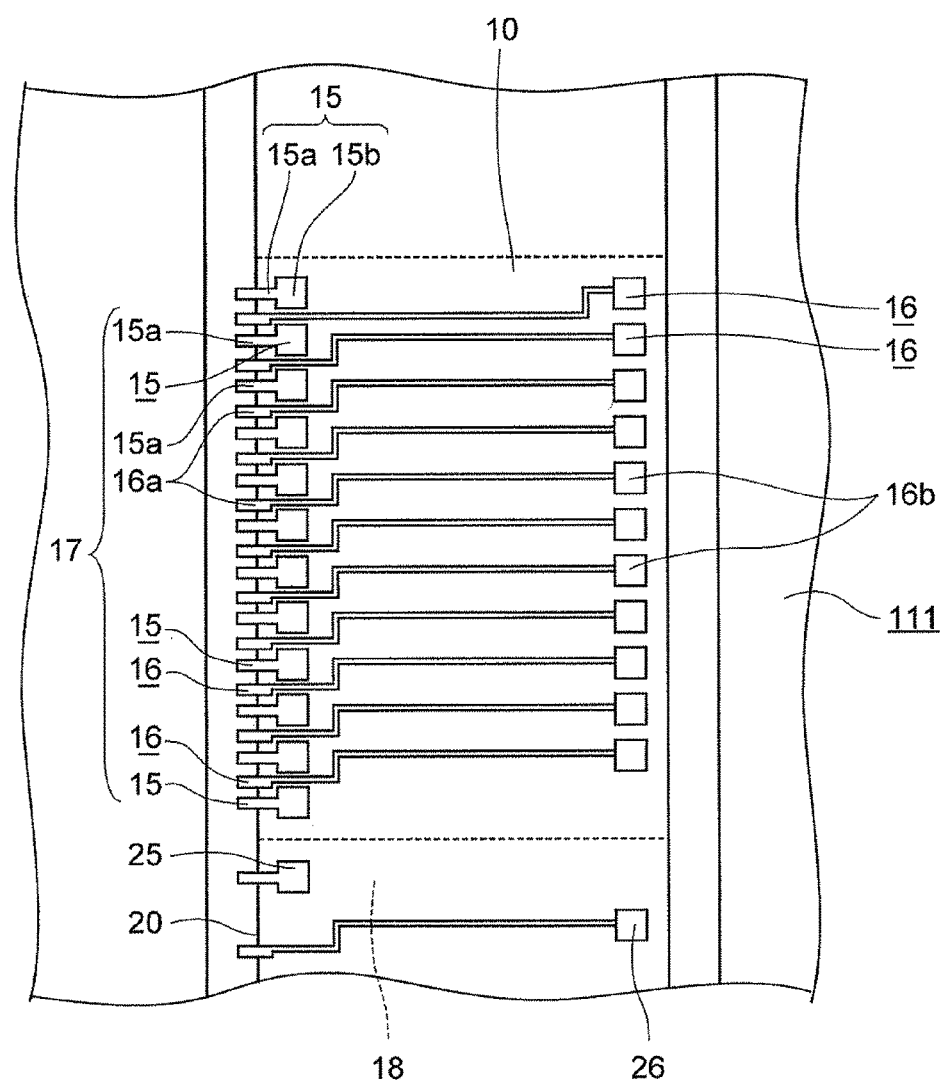
FIG. 27 is a plan view illustrating a device region and a testing region and a region surrounding them formed in the semiconductor wafer in FIG. 26.

A semiconductor wafer 111 will be described with reference to FIG. 26 and FIG. 27. In the semiconductor wafer 1 according to the first embodiment, the groove portions 20 and 21 are formed. The semiconductor wafer 111 is different from the semiconductor wafer 1 in that groove portions 21 are not formed but only groove portions 20 are formed. Accordingly, the semiconductor wafer 111 is formed such that a plurality of groove portions 20 are arranged at regular intervals and the groove portions are formed in the shape of stripes not intersecting with each other.

Figure 28:
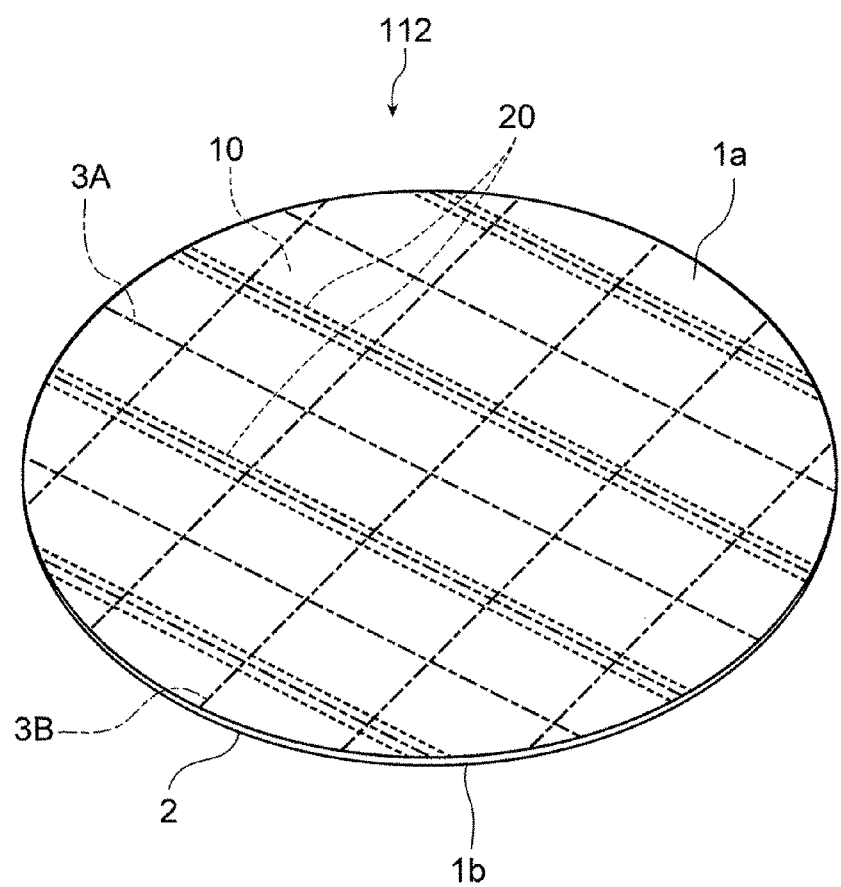
FIG. 28 is a perspective view illustrating the entire semiconductor wafer according to still another embodiment of the present invention.

A semiconductor wafer 112 illustrated in FIG. 28 is the same as the semiconductor wafer 111 in that only groove portions 20 are formed, but the groove portion 20 is formed along every other scribe line 3A.

In the semiconductor wafer 1, the device region 10 and the testing region 18 are in contact with the four groove portions 20 and 21, so that the device region 10 and the testing region 18 are in contact with the groove portions 20 and 21 in the four directions, that is, upper, lower, right and left directions. Accordingly, as illustrated in FIG. 18, the device plate 60 manufactured from the semiconductor wafer 1 is covered by the same resin as that of the in-groove insulating portions 22a at the four side surfaces.

In contrast, in the semiconductor wafer 111, the device region 10 and the testing region 18 are in contact with the groove portions 20 only in the two, that is, right and left directions. Accordingly, a device plate using the semiconductor wafer in which the groove portions are formed in the shape of stripes as in the semiconductor wafer 111 is as follows. This device plate has two sets of opposite side surfaces, which are structured such that only the one set of opposite side surfaces is covered by resin but the other set of opposite side surfaces is not covered by any resin.

Note that though not illustrated, when this device plates are laminated, the laminated chip package can be obtained by forming connection electrodes on the opposite two side surfaces. This laminated chip package has a both-side wiring structure in which the connection electrodes are formed on both of the opposite faces.

In the semiconductor wafer 112, the device region 10 and the testing region 18 are in contact with the groove portion 20 only in any one of right and left directions. Therefore, when the semiconductor wafer in which the groove portion is formed along every other scribe line as in the semiconductor wafer 112 is used, the end faces of the wiring electrodes appear only one of the side surfaces in the device plate. The other side surfaces are not covered by any resin.

What is claimed is:

1. A laminated chip package in which a plurality of semiconductor plates are laminated, each of the semiconductor plates having a semiconductor device and a wiring electrode connected to the semiconductor device, wherein
    an inner electrode for examination is provided, the inner electrode for examination having two end faces,
    an end face of the inner electrode for examination is formed on at least one side surface for wiring of a plurality of side surfaces of the plurality of semiconductor plates,
    the inner electrode for examination is formed inside of the at least one side surface for wiring, the inner electrode for examination has a turn structure, the two end faces of the inner electrode are both formed on and are both on a same plane with the same at least one side surface for wiring, and
    an outer electrode for examination is provided, which is configured to connect the end faces of the inner electrode for examination along a lamination direction of the plurality of semiconductor plates, only for two adjacent semiconductor plates of the plurality of semiconductor plates.

2. The laminated chip package according to claim 1,
    wherein the semiconductor plate, which is laminated at an uppermost position of the plurality of semiconductor plates, is a surface layer plate that includes a wiring electrode for examination in place of the inner electrode for examination having a similar structure than that of the wiring electrode,
    wherein an end face of the wiring electrode for examination is formed on the at least one side surface for wiring, and
    wherein a plurality of outer electrodes for examination are provided, and at least one of the outer electrodes for examination connects the end face of the wiring electrode for examination and at least one end face of the inner electrode for examination along the lamination direction.

3. The laminated chip package according to claim 2,
    wherein two wiring electrodes for examination are provided, and a serial line for examination is formed to be continuous from one of the wiring electrodes for examination to another of the wiring electrodes for examination together with all of the outer electrodes for examination and the inner electrode for examination.

4. The laminated chip package according to claim 1,
    wherein a plurality of outer electrodes for examination are provided, and the outer electrodes for examination are intermittently arranged along the lamination direction.

5. The laminated chip package according to claim 1,
    wherein a plurality of outer electrodes for examination are provided, and a plurality of outer electrode columns are provided in each of which the outer electrodes for examination are intermittently arranged along the lamination direction.

6. The laminated chip package according to claim 1,
    wherein both end faces of the inner electrode for examination are connected to the outer electrode for examination at both ends thereof.

7. The laminated chip package according to claim 1,
    wherein the outer electrode for examination is formed having a height along the lamination direction larger than a thickness of a semiconductor plate.

8. The laminated chip package according to claim 1,
    wherein a plurality of outer electrodes for examination are provided, and each of the outer electrodes for examination is provided for different ones of the plurality of semiconductor plates.

9. A laminated chip package in which a plurality of semiconductor plates are laminated, each of the semiconductor plates having a semiconductor device and a wiring electrode connected to the semiconductor device, wherein
    an end face of at least one inner electrode for examination is formed on at least one side surface for wiring of a plurality of side surfaces of the plurality of semiconductor plates, the at least one inner electrode for examination being formed inside of the at least one side surface for wiring, an outer electrode for examination is provided, which is configured to connect the end faces of the inner electrodes for examination along a lamination direction of the plurality of semiconductor plates, only for two adjacent semiconductor plates of the plurality of semiconductor plates, end faces of the wiring electrodes are formed on the side surface for wiring, and a connection electrode is further provided which connects the end faces of the wiring electrodes arranged along the lamination direction in a manner to step over all of the semiconductor plates.

10. A laminated chip package in which a plurality of semiconductor plates are laminated, each of the semiconductor plates having a semiconductor device and a wiring electrode connected to the semiconductor device, wherein inner electrodes for examination are provided, each inner electrode for examination having two end faces, an end face of at least one inner electrode for examination is formed on at least one side surface for wiring of a plurality of side surfaces of the plurality of semiconductor plates, the at least one inner electrode for examination being formed inside of the at least one side surface for wiring, one of the semiconductor plates, which is laminated at an uppermost position of the plurality of semiconductor plates, is a surface layer plate that includes a wiring electrode for examination in place of an inner electrode for examination having a similar structure than that of the wiring electrode, an end face of the wiring electrode for examination is formed on the side surface for wiring, a plurality of outer electrodes for examination are provided, which are configured to connect the end faces of the inner electrodes for examination along a lamination direction of the plurality of semiconductor plates, each of the outer electrodes for examination is only for two adjacent semiconductor plates of the plurality of semiconductor plates, and at least one of the outer electrodes for examination connects the end face of the wiring electrode for examination and the end face of the at least one inner electrode for examination along the lamination direction, each of the semiconductor plates further comprises a surface insulating layer formed to cover the respective semiconductor device, and the wiring electrode for examination is formed in a protruding shape rising above a surface of the surface insulating layer, and the end face of the wiring electrode for examination is formed in a projecting end face projecting outward from the surface of the surface insulating layer.

11. A semiconductor substrate having a plurality of groove portions formed along scribe lines, comprising:

a device region in contact with at least any one of the plurality of groove portions and having a semiconductor device formed therein;

a surface insulating layer formed in the plurality of groove portions and to cover the device region so as to constitute a surface layer of the semiconductor substrate, wherein the surface insulating layer completely fills the plurality of groove portions;

an inner electrode for examination formed in a protruding shape rising above a surface of the surface insulating layer, and having extended terminal portions extended inside the groove portion which are formed on both end portions thereof, wherein an entirety of the inner electrode for examination is flat without bending and the inner electrode is formed so as to not extend completely across the any one of the plurality of groove portions.

12. The semiconductor substrate according to claim 11, further comprising:

a wiring electrode connected to the semiconductor device and formed in a protruding shape rising above a surface of the surface insulating layer.

13. The semiconductor substrate according to claim 12, wherein the surface insulating layer is structured integrally with an in-groove insulating portion formed inside the plurality of groove portions, and wherein the wiring electrode has an extended terminal portion extended from the device region to an inside of the plurality of groove portions and formed in a protruding shape rising above a surface of the in-groove insulating portion.

14. The semiconductor substrate according to claim 12, wherein the wiring electrode has a cross side surface projecting outward from the surface of the surface insulating layer and crossing with the surface of the surface insulating layer, a top end face projecting outward from the surface of the surface insulating layer and disposed along the surface of the surface insulating layer, and an embedded portion embedded inward from the surface of the surface insulating layer.

15. A semiconductor substrate having a plurality of groove portions formed along scribe lines, comprising:

a device region in contact with at least any one of the plurality of groove portions and having a semiconductor device formed therein;

a surface insulating layer formed to cover the device region and constituting a surface layer of the semiconductor substrate;

an inner electrode for examination formed in a protruding shape rising above a surface of the surface insulating layer, and having extended terminal portions extended inside the groove portion which are formed on both end portions thereof;

a wiring electrode connected to the semiconductor device and formed in a protruding shape rising above a surface of the surface insulating layer;

a connecting pad connected to the semiconductor device; and a protecting insulating layer having a connecting hole formed at a position for forming the connecting pad, the protecting insulating layer being disposed under the surface insulating layer and formed to cover the device region, wherein the wiring electrode has an electrode pad having an expanded height from a side outer than the surface of the surface insulating layer to the connecting pad.

16. The semiconductor substrate according to claim 11, wherein the inner electrode for testing is formed in a turn structure.

17. The semiconductor substrate according to claim 12, wherein the turn structure is substantially U-shaped.

18. The laminated chip package according to claim 1, wherein the at least one side surface for wiring is a flat surface.

19. The laminated chip package according to claim 18, wherein the outer electrode is formed as a protrusion on the flat surface.

* * * * *